United States Patent
Yamaya et al.

(10) Patent No.: US 10,444,383 B2
(45) Date of Patent: Oct. 15, 2019

(54) PARTIAL-RING PET DEVICE AND PET DEVICE

(71) Applicant: NATIONAL INSTITUTES FOR QUANTUM AND RADIOLOGICAL SCIENCE AND TECHNOLOGY, Chiba shi, Chiba (JP)

(72) Inventors: Taiga Yamaya, Chiba (JP); Hideaki Tashima, Chiba (JP)

(73) Assignee: NATIONAL INSTITUTES FOR QUANTUM AND RADIOLOGICAL SCIENCE AND TECHNOLOGY, Chiba-shi (JP)

( * ) Notice: Subject to any disclaimer, the term of this patent is extended or adjusted under 35 U.S.C. 154(b) by 0 days.

(21) Appl. No.: 15/895,501

(22) Filed: Feb. 13, 2018

(65) Prior Publication Data

US 2018/0239037 A1    Aug. 23, 2018

(30) Foreign Application Priority Data

Feb. 20, 2017    (JP) .................................. 2017-029405

(51) Int. Cl.
*G01T 1/29*    (2006.01)
*G01T 1/164*    (2006.01)
*G01R 33/48*    (2006.01)

(52) U.S. Cl.
CPC .......... *G01T 1/2985* (2013.01); *G01T 1/1647* (2013.01); *G01R 33/481* (2013.01)

(58) Field of Classification Search
CPC .... G01T 1/2985; G01T 1/1647; G01R 33/481
USPC .................................................. 250/363.05
See application file for complete search history.

(56) References Cited

U.S. PATENT DOCUMENTS

| 2008/0061241 A1* | 3/2008 | Rietzel | A61B 6/032 250/363.05 |
| 2010/0108896 A1* | 5/2010 | Surti | G01T 1/00 250/363.04 |
| 2012/0150018 A1* | 6/2012 | Yamaya | A61N 5/1049 600/411 |

(Continued)

FOREIGN PATENT DOCUMENTS

| JP | 2007-71858 A | 3/2007 |
| JP | 5339561 B2 | 11/2013 |
| JP | 5713468 B2 | 5/2015 |

OTHER PUBLICATIONS

P. Crespo et al. "On the detector arrangement for in-beam PET for hadron therapy monitoring," Phys. Med Biol., vol. 51, pp. 2143-2163, 2006.

(Continued)

*Primary Examiner* — David P Porta
*Assistant Examiner* — Gisselle Gutierrez
(74) *Attorney, Agent, or Firm* — Oliff PLC

(57) ABSTRACT

A partial-ring PET device, in which some of coincidence radiation detectors to be arranged in a ring shape around a field of view for detecting lines of response of annihilation radiations are missing, is compensated for a drop in image quality due to the missing of the coincidence radiation detectors by including single gamma-ray radiation detectors for detecting at least either one of the annihilation radiations as a single gamma-ray. This can reduce missing of projection angles and reduce artifacts in PET images.

13 Claims, 23 Drawing Sheets

(56) References Cited

U.S. PATENT DOCUMENTS

| | | | |
|---|---|---|---|
| 2015/0087960 A1* | 3/2015 | Treffert | A61B 6/025 600/411 |
| 2015/0115162 A1* | 4/2015 | Tashima | A61B 6/037 250/363.03 |
| 2015/0331115 A1* | 11/2015 | Nelson | G01T 1/1611 250/363.03 |
| 2017/0016999 A9* | 1/2017 | Nelson | G01T 1/1611 |
| 2017/0154444 A1* | 6/2017 | Kobayashi | A61B 6/032 |
| 2018/0136340 A1* | 5/2018 | Nelson | G01T 1/1644 |
| 2018/0172847 A1* | 6/2018 | Nelson | A61B 6/4417 |
| 2018/0172848 A1* | 6/2018 | Nelson | A61B 6/4417 |
| 2018/0172849 A1* | 6/2018 | Nelson | A61B 6/4417 |

OTHER PUBLICATIONS

Junichi Ohi et al., "Development of a 'Flexible PET' System Habving Multi-Modality Compatibility" Shimadzu Review, vol. 72, No. 3-4, pp. 65-72, 2015.

Frank P. Difilippo, "Enhanced PET resolution by combining pinhole collimation and coincidence detection," Phys. Med. Biol., vol. 60, pp. 7969-7984, 2015.

E. Yoshida et al., "Sensitivity booster for DOI-PET scanner by utilizing Compton scattering events between detector blocks," NIMA, vol. 763, pp. 502-509, 2014.

* cited by examiner

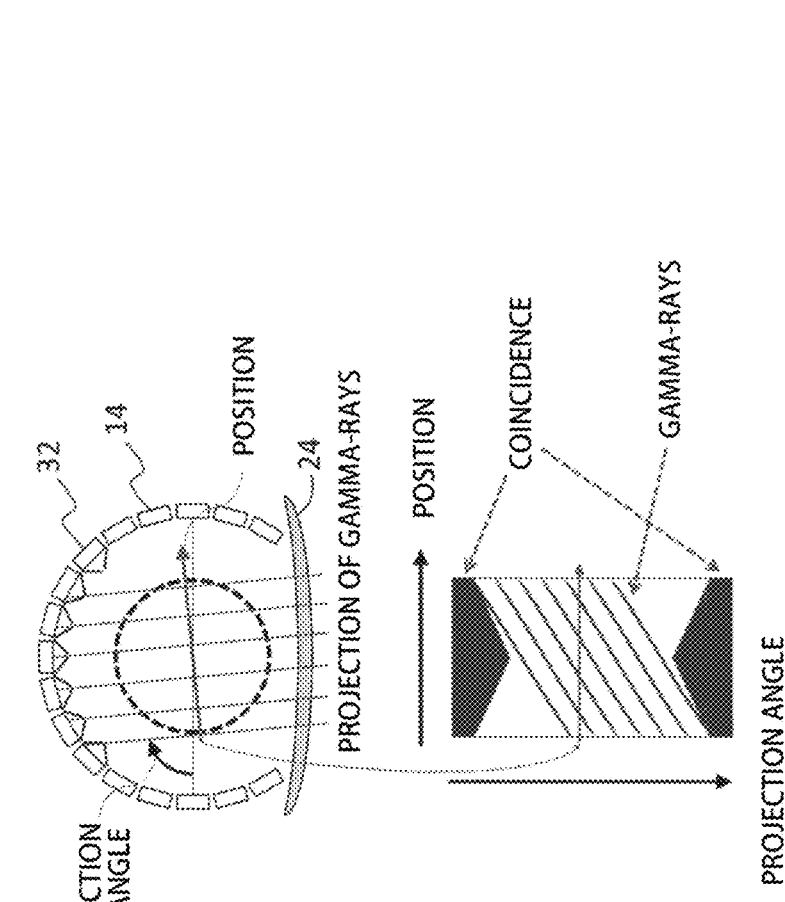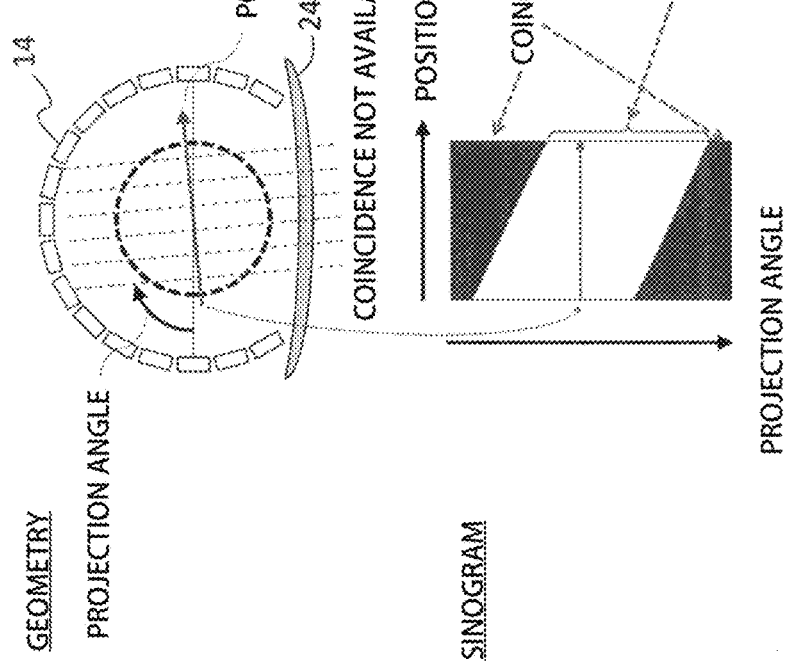

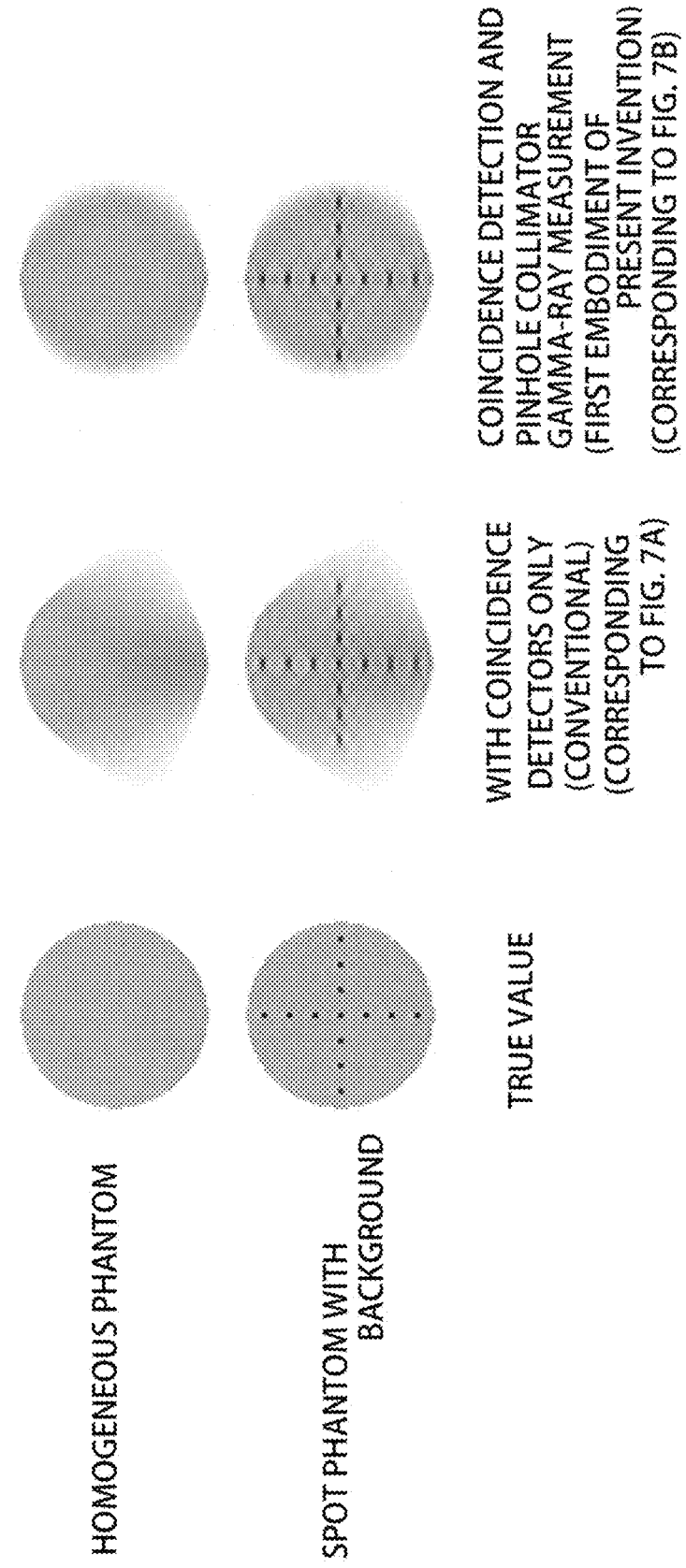

PARTIAL-RING PET DEVICE AND PET DEVICE

CROSS-REFERENCE TO RELATED APPLICATION

The disclosure of Japanese Patent Application No. 2017-29405 filed on Feb. 20, 2017 including specifications, drawings and claims is incorporated herein by reference in its entirety.

TECHNICAL FIELD

The present invention relates to a partial-ring PET device and a PET device, and more particularly to a partial-ring PET device and a PET device which are suitably used for a hybrid PET/MRI device and can compensate a drop in image quality due to missing of coincidence radiation detectors.

BACKGROUND ART

PET devices in which coincidence radiation detectors for detecting lines of response of annihilation radiations are arranged in a ring shape around a field of view (see Japanese Patent Application Laid-Open No. 2007-71858 (hereinafter, Patent Literature 1) and Japanese Patent No. 5339561 (hereinafter, Patent Literature 2)) have been widely known.

PET needs to obtain lines of response (LORs) at various angles (projection angles). In PET, radiation detectors are therefore arranged in a shape of ring to surround a measurement target.

On the other hand, partially opened ring (referred to as "partial-ring") PET devices with a part of the radiation detectors normally arranged in a ring shape for detecting line of response are removed have been developed in P. Crespo et al., "On the detector arrangement for in-beam PET for hadron therapy monitoring," Phys. Med. Biol., vol. 51 (2006), pp. 2143-2163 (PET Imaging of Irradiation Field for Particle-Beam Cancer Therapy) (hereinafter, Non-Patent Literature 1) and Jun'ichi Oi et al., "Development of a 'Flexible PET' System Having Multi-Modality Compatibility," Shimadzu Review, vol. 72, Nos. 3 and 4, (2016.3), pp. 65-71 (Multi-Purpose PET) (hereinafter, Non-Patent Literature 2). FIG. 1 shows an example of an opposed gamma camera type partial-ring PET device developed by the GSI Helmholtz Centre for Heavy Ion Research in Germany. In the diagram, the reference numeral 10 represents a field of view, the reference numeral 12 lines of response, and the reference numeral 14 coincidence radiation detectors (referred to as coincidence detectors) for detecting the lines of response 12.

A hybrid PET/MRI device in which a PET device and an MRI device are integrated to obtain both a PET image and an MRI image has also been developed (see Japanese Patent No. 5713468 (hereinafter, Patent Literature 3)). Like Non-Patent Literature 2, a PET device to be arranged and used in the bore of an MRI device (referred to as an MRI bore) without a change to the existing MRI device is also under development.

If the bed and radio frequency (RF) coil of an existing MRI device are used, there is room to arrange radiation detectors over a measurement target but no space to arrange radiation detectors under the measurement target. If the radiation detectors are arranged in a ring shape between the bed and the RF coil of the existing MRI device, the center position of the measurement target deviates from the center of the MRI bore. Such a configuration is not desirable for MRI imaging.

SUMMARY OF INVENTION

Technical Problem

If a full-ring PET device is used in an MRI bore, as shown in a comparative example of a C-shaped partial-ring PET device in FIG. 2, some of the coincidence detectors (in FIG. 2, ones between the field of view 10 and a bed 24) are desirably structurally removed. In the diagram, the reference numeral 20 represents an MRI device, 22 represents the bore of the MRI device 20 (MRI bore), and 26 represents an RF coil.

However, if some of the coincidence radiation detectors are removed from the PET device, the projection angles are limited by the missing area. This causes a problem that the condition for complete image reconstruction fails to be met and strong artifacts appear in the PET image.

As a technique for enhancing PET image quality, Frank P DiFilippo, "Enhanced PET resolution by combining pinhole collimation and coincidence detection," Phys. Med. Biol., vol. 60 (2015), pp. 7969-7984 (hereinafter, Non-Patent Literature 3), proposes combining pinhole collimators with coincidence counting to improve the resolution of a PET image. However, unlike the present invention, this technique is not directed to compensating a drop in image quality due to the missing of coincidence radiation detectors of a partial-ring PET device.

E. Yoshida et al., "Sensitivity booster for DOI-PET scanner by utilizing Compton scattering events between detector blocks," NIMA, Vol. 763, pp. 502-509, 2014 (hereinafter, Non-Patent Literature 4), describes a technique for improving sensitivity by handling Compton events between PET detector blocks as a coincidence event by using position information in addition to time information and energy information. Like the foregoing Non-Patent Literature 3, the technique is not directed to compensating a drop in image quality due to the missing of coincidence radiation detectors.

Solution to Problem

The present invention has been made in order to solve the above-described problems in the conventional technique, and a first object thereof is to reduce missing of projection angles and reduce artifacts in PET images of a partial-ring PET device in which some of coincidence radiation detectors are removed.

A second object of the present invention is to provide a partial-ring PET device suitable for use in a hybrid PET/MRI device.

A third object of the present invention is to provide a PET device in which coincidence radiation detectors are combined with single gamma-ray radiation detectors.

The first object of the present invention is achieved by the provision of a partial-ring PET device in which some of coincidence radiation detectors to be arranged in a ring shape around a field of view are missing, the coincidence radiation detectors being configured to detect a line of response of annihilation radiations, wherein a single gamma-ray radiation detector configured to detect at least either one of the annihilation radiations as a single gamma-ray is provided to compensate a drop in image quality due to missing of the coincidence radiation detectors.

Here, the partial-ring PET device may include: the coincidence radiation detectors configured to detect the line of response of the annihilation radiations, the coincidence radiation detectors being arranged in a partially-missing ring shape around the field of view; the single gamma-ray radiation detector that is arranged in a position opposed to the missing area with the field of view therebetween and is configured to detect at least either one of the annihilation radiations as a single gamma-ray; and a circuit configured to reconstruct an image while compensating the drop in the image quality due to the missing of the coincidence radiation detectors on the basis of a signal from the coincidence radiation detectors and a signal from the single gamma-ray radiation detector.

The single gamma-ray radiation detector may be a collimator radiation detector that includes a collimator configured to identify an incident direction of an incident gamma-ray.

The collimator may be a pinhole collimator.

The single gamma-ray radiation detector may be a Compton camera radiation detector including a scattering detector configured to cause Compton scattering of the incident gamma-ray and an absorption detector configured to photoelectrically absorb a scattered radiation.

The coincidence radiation detectors may also serve as absorption detectors of the Compton camera radiation detector.

The coincidence radiation detectors may also serve as scattering detectors of the Compton camera radiation detector.

All the coincidence radiation detectors may be Compton camera radiation detectors, and whether Compton scattering or absorption occurs may be determined from energy measured by the scattering detectors of the Compton camera radiation detectors to allow detection of a line of response between the scattering detectors.

The single gamma-ray radiation detector may be installed on an opposite side of the field of view from the missing area of the coincidence radiation detectors of a detector ring.

An installation area of the single gamma-ray radiation detector may include a missing area in which the single gamma-ray radiation detector is not arranged.

The second object of the present invention is achieved by configuring the partial-ring PET device to be able to be arranged in a bore of an MRI device.

The partial-ring PET device may include a Compton camera radiation detector, and a scattering detector of the Compton camera radiation detector may be configured to be able to be arranged outside a radio frequency coil of the MRI device.

The partial-ring PET device may include a Compton camera radiation detector, and a scattering detector of the Compton camera radiation detector may be electromagnetically shielded so that the scattering detector can be arranged inside a radio frequency coil of the MRI device.

The third object of the present invention is achieved by the provision of a PET device configured to reconstruct an image by combining signals that a plurality of coincidence radiation detectors and a plurality of single gamma-ray radiation detectors arranged to cover a field of view output upon reception of annihilation radiations.

The present invention provides a PET device, comprising a plurality of coincidence radiation detectors arranged to cover a field of view, a plurality of single gamma-ray radiation detectors arranged to cover the same field of view, and a circuit configured to reconstruct an image on a basis of a signal from the coincidence radiation detectors and a signal from the single gamma-ray radiation detector output upon reception of annihilation radiations.

The present invention further provides a hybrid PET/MRI device, comprising an MRI device with a bore, and the partial-ring PET device according to the present invention arranged in the bore of the MRI device.

According to the present invention, a drop in image quality due to the missing of the coincidence radiation detectors of the partial-ring PET device is compensated by the provision of the single gamma-ray radiation detector(s). This can reduce the missing of the projection angles and reduce artifacts in the PET image.

A device other than the partial-ring PET device can also be configured to reconstruct an image by combining signals that a plurality of coincidence radiation detectors and a plurality of single gamma-ray radiation detectors arranged to cover a field of view output upon reception of annihilation radiations.

These and other novel features and advantages of the present invention will become apparent from the following detailed description of preferred embodiments.

BRIEF DESCRIPTION OF DRAWINGS

The preferred embodiments will be described with reference to the drawings, wherein like elements have been denoted throughout the figures with like reference numerals, and wherein;

FIGS. 7A and 7B are diagrams comparatively showing sinograms for describing an effect of the same;

FIG. 8 is a diagram comparatively showing reconstruction results for describing the effect of the same;

DESCRIPTION OF EMBODIMENTS

Embodiments of the present invention will be described below in detail with reference to the drawings. It should be noted that the present invention is not limited to the contents described in the following embodiments and practical examples. The components of the embodiments and practical examples described below may include ones easily conceivable by those skilled in the art, substantially identical ones, and ones within the range of equivalency. The components disclosed in the embodiments and practical examples described below may be combined as appropriate, and may be selected and used as appropriate.

Figure 1:
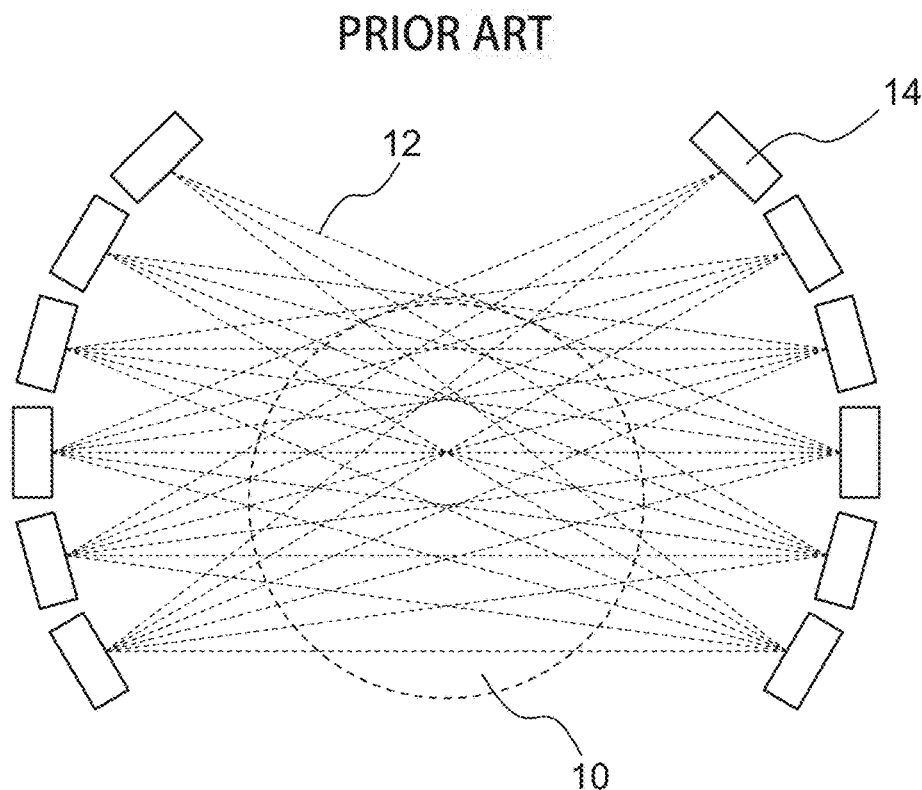
FIG. 1 is a cross-sectional view showing an example of a conventional opposed gamma camera type partial-ring PET device.
Figure 2:
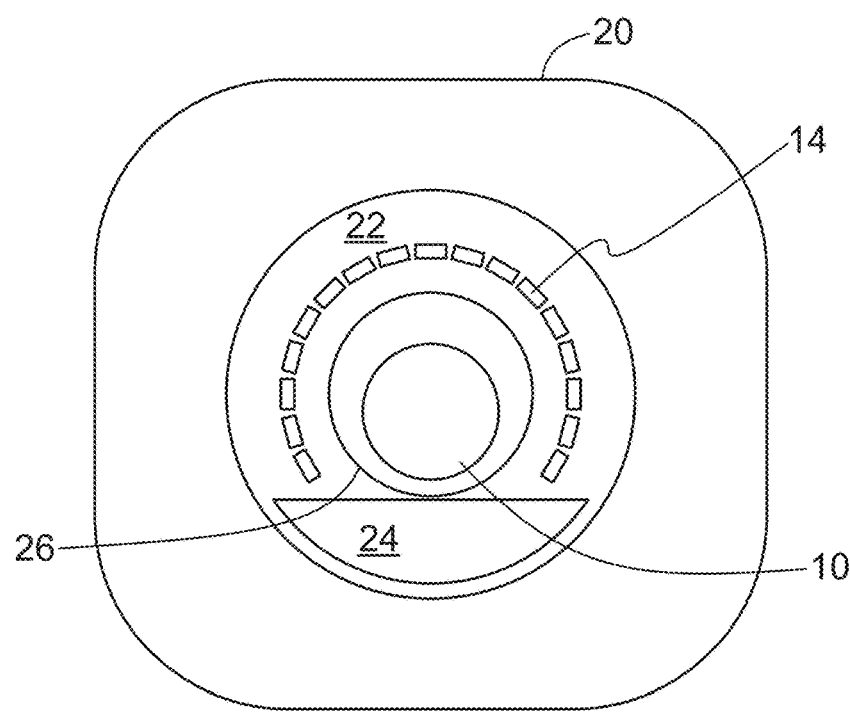
FIG. 2 is a cross-sectional view showing a comparative example of a C-shaped partial-ring PET device inserted and used in an MRI device.
Figure 3:
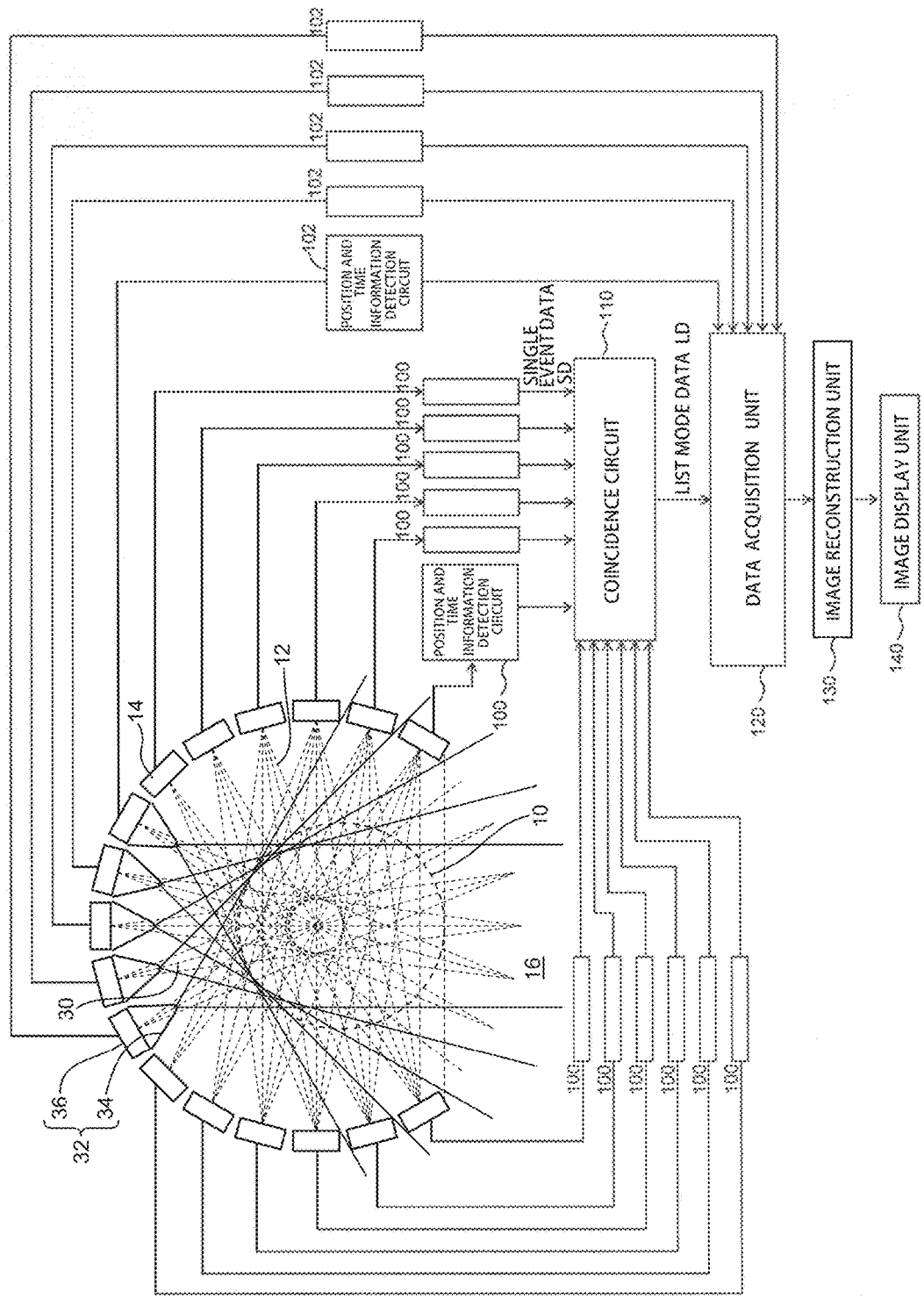
FIG. 3 is a cross-sectional view showing an overall configuration of a first embodiment of the present invention.

A first embodiment of the present invention is a partial-ring PET device including coincidence detectors 14 for detecting lines of response 12 of annihilation radiations. As shown in FIG. 3, some (in FIG. 3, a lower part 16) of the coincidence detectors 14 to be arranged in a ring shape around a field of view 10 are missing. Collimator single gamma-ray radiation detectors (referred to as collimator detectors) 32 are arranged on an opposite side (upper side in the diagram) of the field of view 10 from the missing area 16 to compensate a drop in image quality due to the missing of the coincidence detectors 14. The collimator detectors 32 each include a pinhole collimator 34 for detecting either one of gamma-rays 30 of annihilation radiations occurring as a pair of gamma-rays as if the one is a single gamma-ray (referred to as "single gamma-ray detection").

Figure 4:
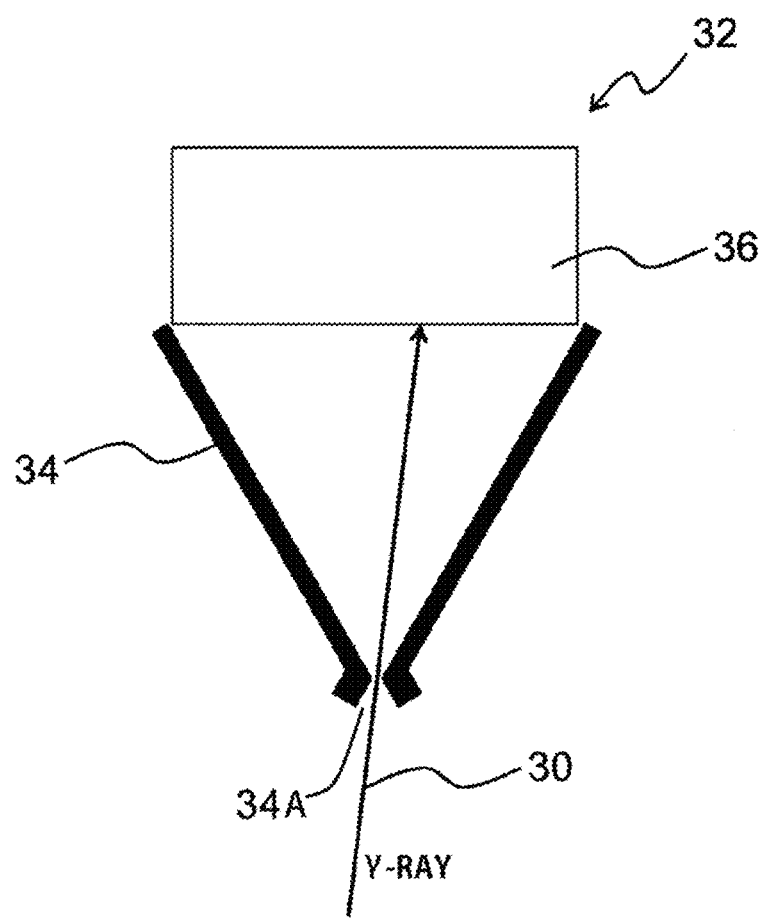
FIG. 4 is an enlarged cross-sectional view of a collimator single gamma-ray radiation detector part of the same.

As shown in detail in FIG. 4, each collimator detector 32 includes a pinhole collimator 34 for letting only a single gamma-ray 30 of a predetermined incident angle to pass, and a radiation detector 36 for detecting the single gamma-ray 30 having passed through the pinhole collimator 34.

The pinhole collimators 34 are not limited to ones of pinhole type and may be multi parallel-hole collimators and multi-pinhole collimators as long as the incident direction of the single gamma-ray 30 can be determined. The shape of the pinholes is not limited to circular, either. For example, loft holes having rectangular openings may be used. A plurality of rectangular openings can be arranged with less dead space, and efficiently have the same shape as that of the detection part of the radiation detector 36.

Next, a method for processing measurement data will be described. A pair of annihilation radiations flying at an angle of approximately 180° are emitted in every direction from a nuclide in a patient's body. Single event data SD is measurement data on either one of the pair of annihilation radiations, obtained from a detector ring by any of position and time information detection circuits 100 shown in FIG. 3. Single event data SD is transmitted to a common coincidence circuit 110, and converted into list mode data LD which is information on a coincidence pair.

A data acquisition unit 120 stores the list mode data LD in a storage medium.

Outputs of the collimator detectors 32 are also stored into the storage medium by the data acquisition unit 120 via position and time information detection circuits 102.

The data stored in the storage medium is transmitted to an image reconstruction unit 130 for image reconstruction calculation. A reconstructed image is then displayed on an image display unit 140.

Figure 5:
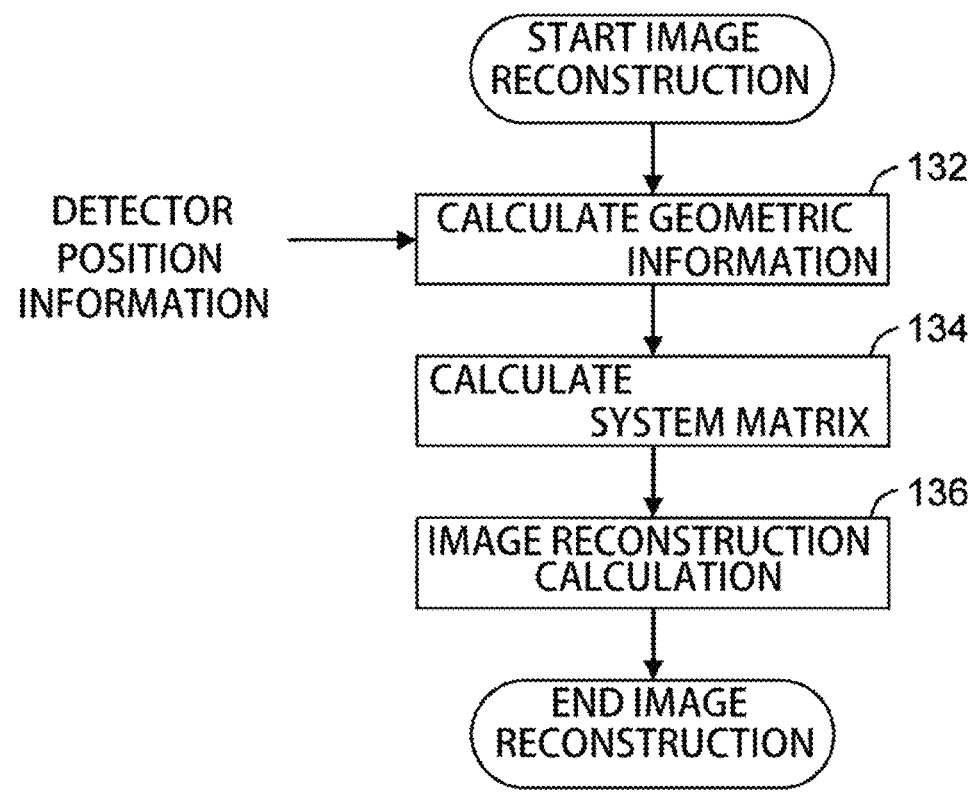
FIG. 5 is a flowchart showing a procedure of image reconstruction calculation of the same.

FIG. 5 is a flowchart showing a procedure of the image reconstruction calculation by the image reconstruction unit 130. In step 132, the image reconstruction unit 130 calculates geometric information about the lines of response of the coincidence measurement and the lines of projection of the collimator measurement on the basis of detector position information stored in the list mode data LD. In step 134, the image reconstruction unit 130 calculates system matrix elements. As for a method for using a system matrix in image reconstruction, the image reconstruction unit 130 may calculate and store the system matrix in advance and sequentially read the same during image reconstruction calculation. The image reconstruction unit 130 may sequentially calculate the system matrix as needed during image reconstruction calculation.

In step 136, the image reconstruction unit 130 performs image reconstruction calculation by using the system matrix.

Figure 6:
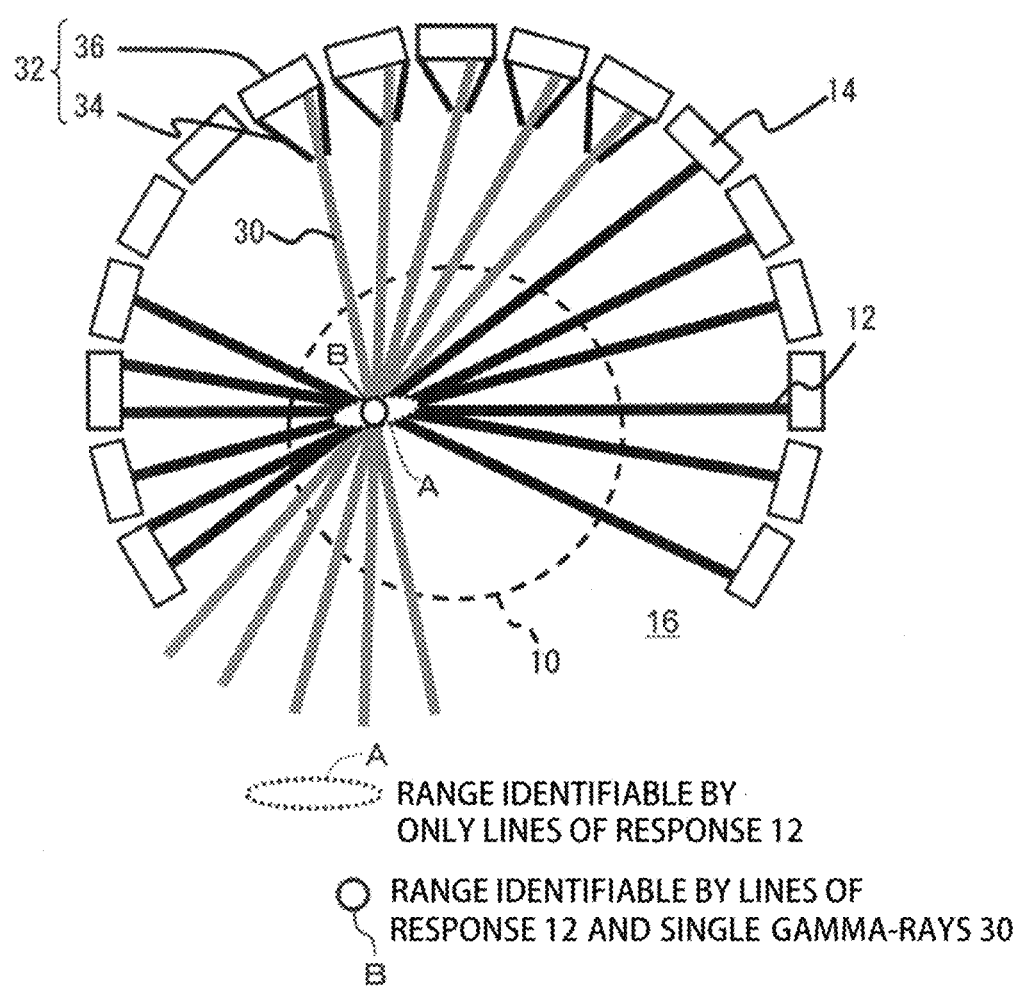
FIG. 6 is a cross-sectional view for describing an operation of the same.

FIG. 6 shows a detection state of lines of response 12 and single gamma-rays 30 according to the first embodiment. With only the lines of response 12 in lateral directions of the diagram, the location of occurrence of gamma-rays can only be identified as being in an elliptical range A as shown in the diagram. Information about the single gamma-rays 30 having sensitivity on the vertical lines can be combined to narrow the lateral identification range of the location of occurrence to B. This can eliminate the direction dependence of spatial resolution and enable acquisition of a high-precision image.

FIG. 7A shows a conventional sinogram when only coincidence detectors 14 are arranged in a C shape. Since vertical projection data is unable to be obtained, there occurs a large continuous missing region in the angle direction in the middle of the sinogram. FIG. 7B shows a sinogram when the upper detectors 32 are replaced with pinhole collimator single gamma-ray radiation detectors according to the first embodiment of the present invention. It can be seen that the completely missing region in FIG. 7A can be roughly sampled in the angle direction.

FIG. 8 shows results of simulations performed with the detector layouts shown in FIGS. 7A and 7B (with a partial ring diameter of 40 cm and a phantom diameter of 11 cm). In the conventional case with only the coincidence detectors shown in FIG. 7A, circular phantoms were largely distorted toward lower left and lower right as shown in the center of FIG. 8, compared to true values shown to the left of FIG. 8. In the case of the first embodiment of the present invention in which the pinhole collimator single gamma-ray radiation detectors shown in FIG. 7B were also used, it was confirmed that the original circles were reconstructed with less distortion as shown to the right of FIG. 8.

According to the present invention, a drop in image quality can thus be compensated by supplementing angle range data that has not been available from a C-shaped detector ring, though not as much compared to the case in which the lines of response are detected all around.

Next, parameters to be taken into consideration in designing the device will be described. Common parameters for collimator type and Compton camera type devices are a detector element size, a detector block size, a partial ring diameter, and the number of detectors. Parameters specific to the collimator type device are a collimator shape, a collimator hole size, a distance from the hole to the radiation detector, and a ratio between the coincidence detectors and the single gamma-ray radiation detectors having a collimator. Parameters specific to the Compton camera type device to be described later are a scattering detector shape, the diameter of the scattering detector arrangement (distance from the absorption detectors), and a pixel size and thickness of the scattering detector elements.

Figure 9:
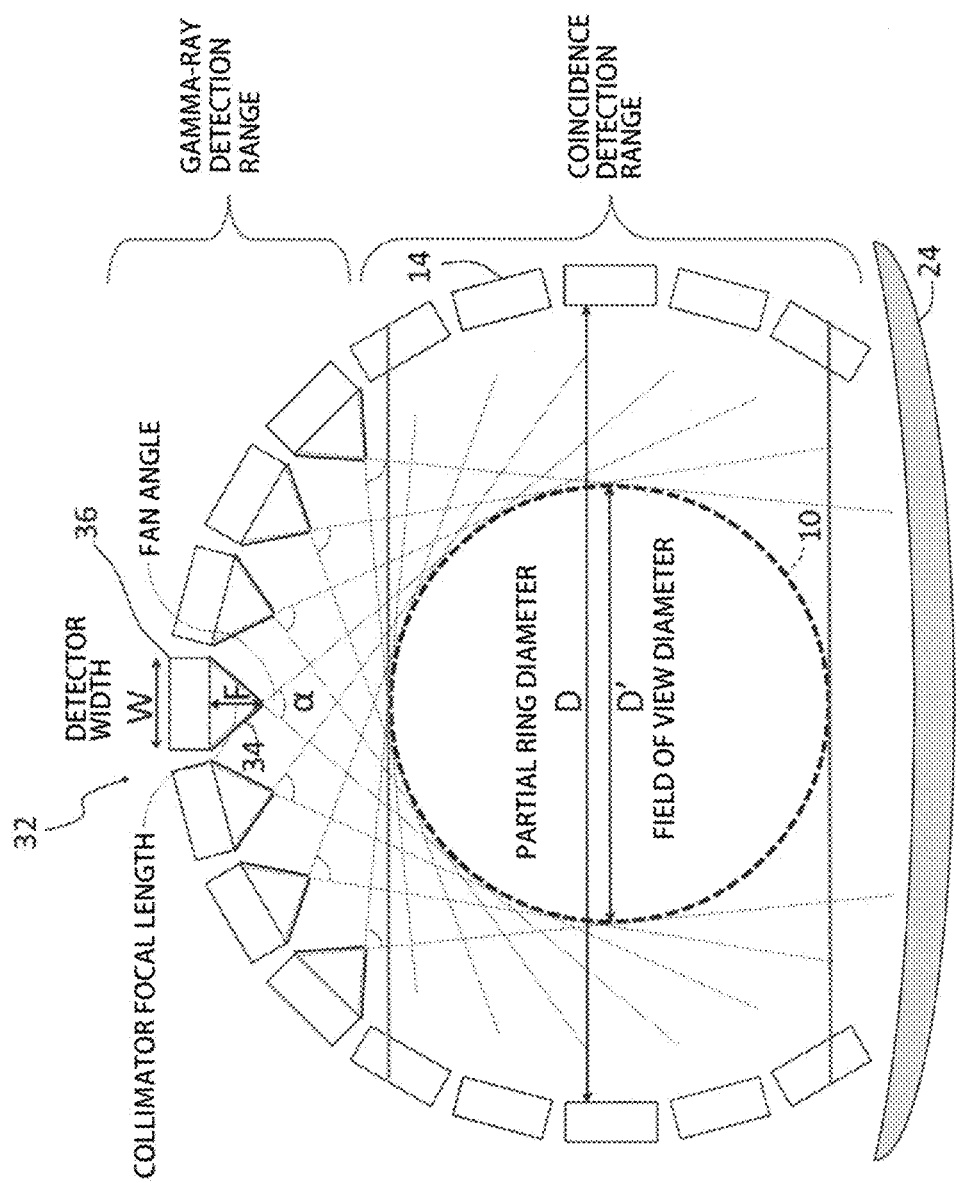
FIG. 9 is a cross-sectional view showing a design example of a pinhole collimator partial-ring PET device.

In the case of a pinhole collimator partial-ring PET device like the first embodiment, the detection of the lines of response (coincidence detection) by coincidence counting provides higher sensitivity than when the gamma-rays are blocked by the collimators. Coincidence detection without a collimator is therefore preferred if there are opposed detectors. FIG. 9 shows a case in which a circular field of view 10 is set. In such a case, coincidence detection using the coincidence detectors 14 is desirably performed within the range where the field of view can be covered in the vertical direction while pinhole single gamma-ray detection is performed by using the detectors 32 lying above.

The pinhole collimator single gamma-ray detection can obtain fan beam projection data. From the principle of tomographic imaging, the measurement target desirably lies within the fan angles α formed by the radiation detectors 36 and the pinhole collimators 34. In view of spatial resolution, the distance (collimator focal length) F from a radiation detector 36 to the hole in the top of the corresponding pinhole collimator 34 is desirably as large as possible. The fan angle α may therefore be set to an angle between the tangents drawn from the position of the hole of the pinhole collimator 34 to the circle of the field of view 10. The relationship between the fan angle α and the collimator focal length F is determined by the following equation:

$$\sin\frac{\alpha}{2} = \frac{D'}{2(D-F)} \quad \text{(Equation 1)}$$

$$F = \frac{W}{2\tan\frac{\alpha}{2}} \quad \text{(Equation 2)}$$

where W is the detector width, D is the diameter of the partial ring, and D' is the diameter of the field of view 10.

The first embodiment has a problem of low sensitivity due to the narrowing of the single gamma-rays 30 by the pinhole collimators 34.

Figure 10:
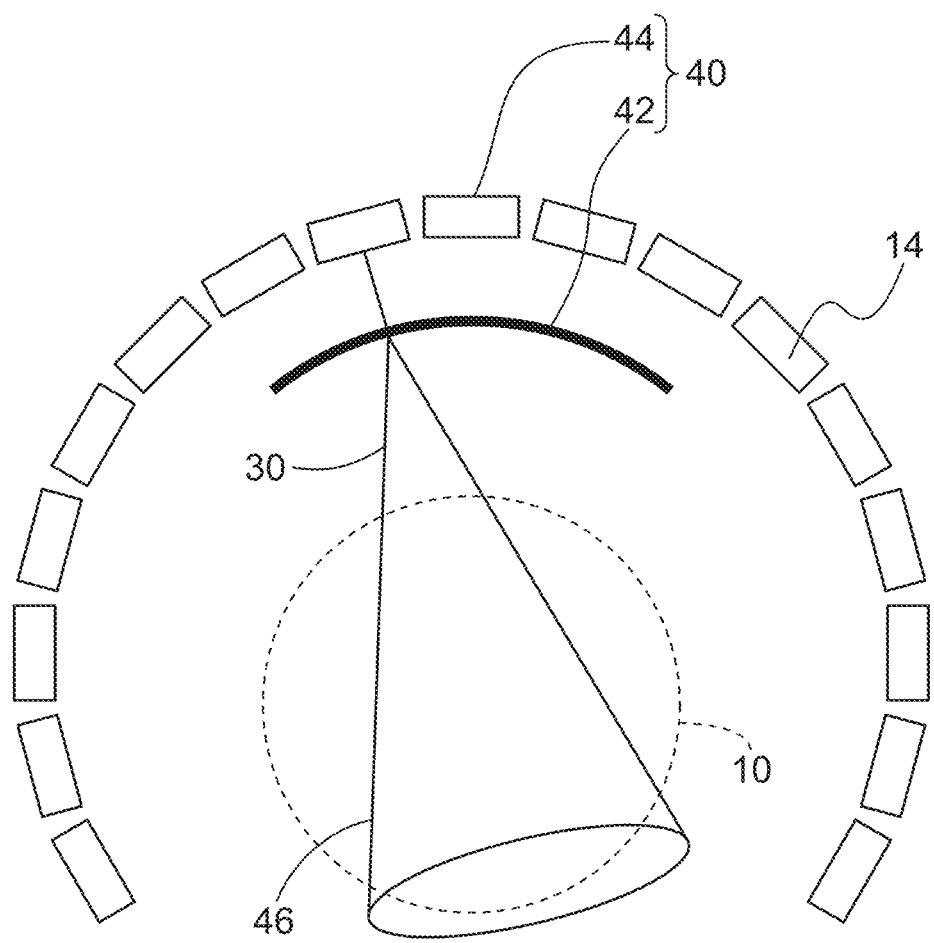
FIG. 10 is a cross-sectional view showing an overall configuration of a second embodiment of the present invention.

Then, in a second embodiment of the present invention, as shown in FIG. 10, Compton camera single gamma-ray radiation detectors (hereinafter, referred to as Compton cameras) 40 including scattering detectors 42 and absorption detectors 44 are used as single gamma-ray radiation detectors.

Figure 11:
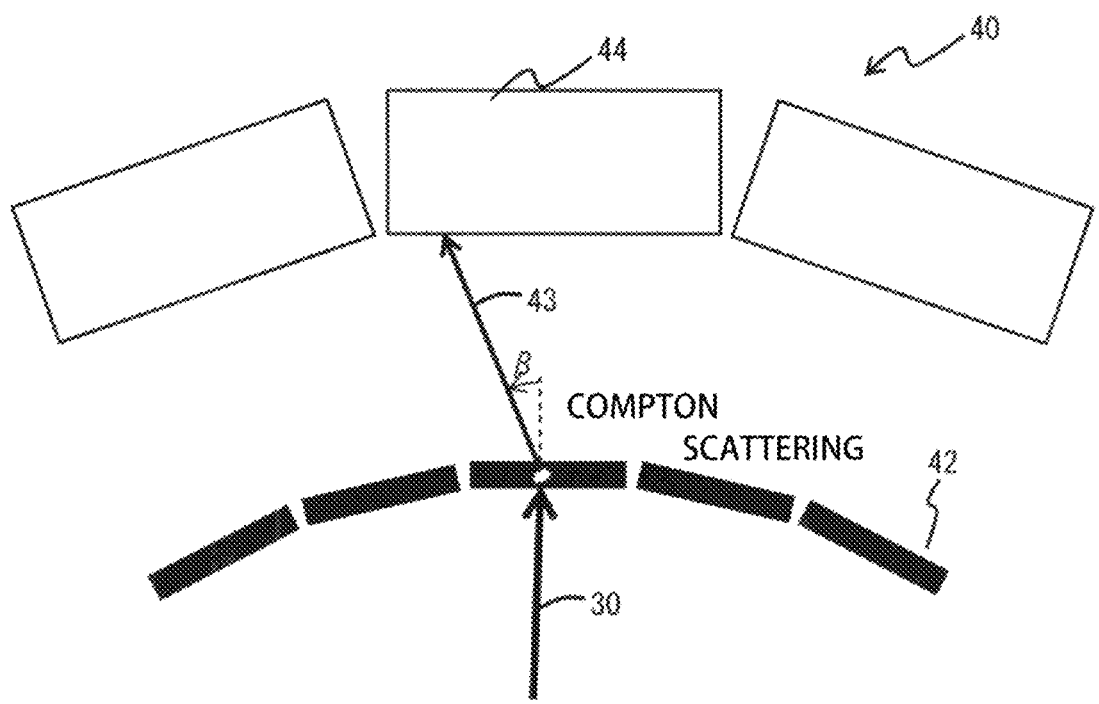
FIG. 11 is an enlarged cross-sectional view of a Compton camera single gamma-ray radiation detector portion of the same.
Figure 12:
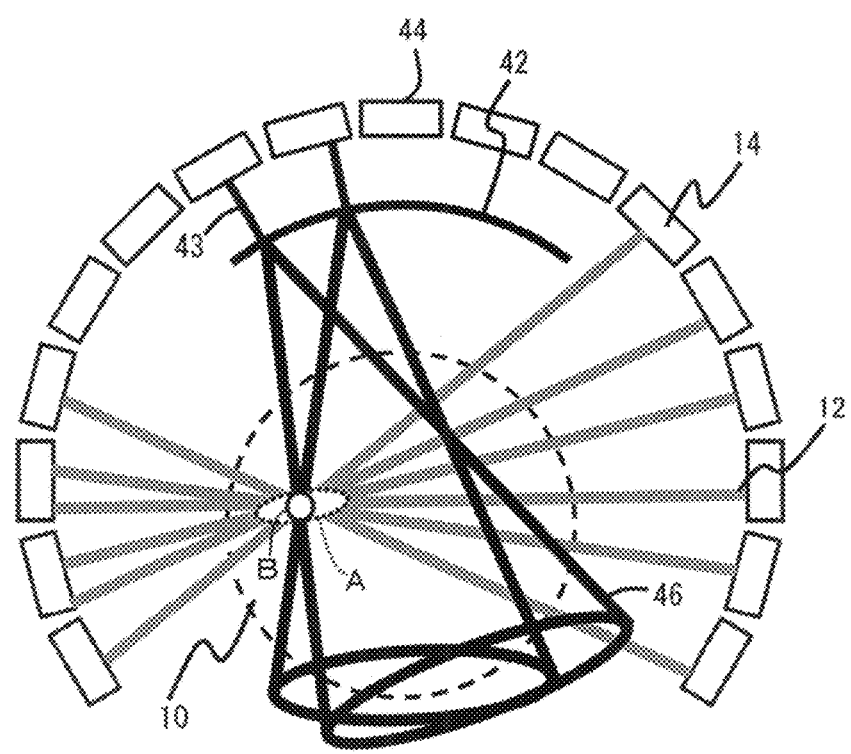
FIG. 12 is a cross-sectional view for describing an operation of the same.

As shown in FIGS. 10 and 11, the Compton cameras 40 count events (referred to as Compton events) in which an incident single gamma-ray 30 causes Compton scattering in a scattering detector 42 and the resulting scattered radiation 43 is (photoelectrically) absorbed by an absorption detector 44. The Compton cameras 40 record the positions and energy of the interactions. If a single gamma-ray 30 causes Compton scattering in a scattering detector 42, the single gamma-ray 30 gives part of its total energy to the scattering detector 42, and changes its traveling direction at an angle (scattering angle) β corresponding to the given energy. If the traveling direction-changed gamma-ray (also referred to as scattered radiation) 43 is absorbed by an absorption detector 44, the rest of the energy is given to the absorption detector 44. The scattering angle β is determined from the given energy by the Klein-Nishina formula. As shown in FIG. 12, the location of occurrence of the gamma-ray 30 can be limited to the surface of a cone 46 (also referred to a conical surface 46) with a line connecting the two detection positions of the scattering detector 42 and the absorption detector 44 as the center axis and with the detection position of the scattering detector 42 as the vertex. If a sufficient number of events are accumulated, the original radioactivity distribution can thus be estimated.

Radiation detectors containing a substance that easily causes Compton scattering can be used as the scattering detectors 42.

In the case of the Compton camera method, the measurement according to the principle of the Compton cameras 40 can be performed by using PET detectors (coincidence detectors 14) for coincidence detection as the absorption detectors 44 and arranging the scattering detectors 42 in front.

More specifically, the coincidence detectors 14 are typically designed to set an energy window to 400 to 600 keV so that gamma-rays of 511 keV can be efficiently detected. Gamma-rays causing Compton scattering in the scattering detectors 42 reach the coincidence detectors 14 as gamma-rays having energy of 511 keV or less. The coincidence detectors 14 can thus be used as the absorption detectors 44 of the Compton cameras 40 if the coincidence detectors 14 are configured to store energy information.

The detected energy information is used to determine the scattering angles β of the Compton events as described above. Gamma-rays that are scattered outside the scattering detectors 42, like inside a substance, and reduced in energy become noise. Whether a Compton event is genuine is thus determined depending on whether the total energy detected sufficiently matches with the energy of the gamma-ray occurred. To detect a PET signal (coincidence event), the energy window is provided and used to detect only gamma-rays of 511 keV.

A coincidence event here refers to a phenomenon in which annihilation radiations (a pair of gamma-rays of 511 keV caused by a single positron pair annihilation) are simultaneously measured. A Compton event refers to a phenomenon in which a gamma-ray is measured as Compton scattering in a scattering detector 42 and, at the same time, measured as photoelectric absorption in an absorption detector 44.

Unlike the collimator method, the Compton camera method is not intended to fully block the gamma-rays. Even if the scattering detectors 42 are placed in front of all the coincidence detectors 14, coincidence events can be obtained because of the presence of gamma-rays transmitted through the scattering detectors 42. As in a third embodiment shown in FIG. 13, the scattering detectors 42 therefore desirably cover a range as wide as possible unless a missing area is provided for the purpose of efficiently transmitting MRI signals or securing the patient's or subject's field of view.

Figure 13:
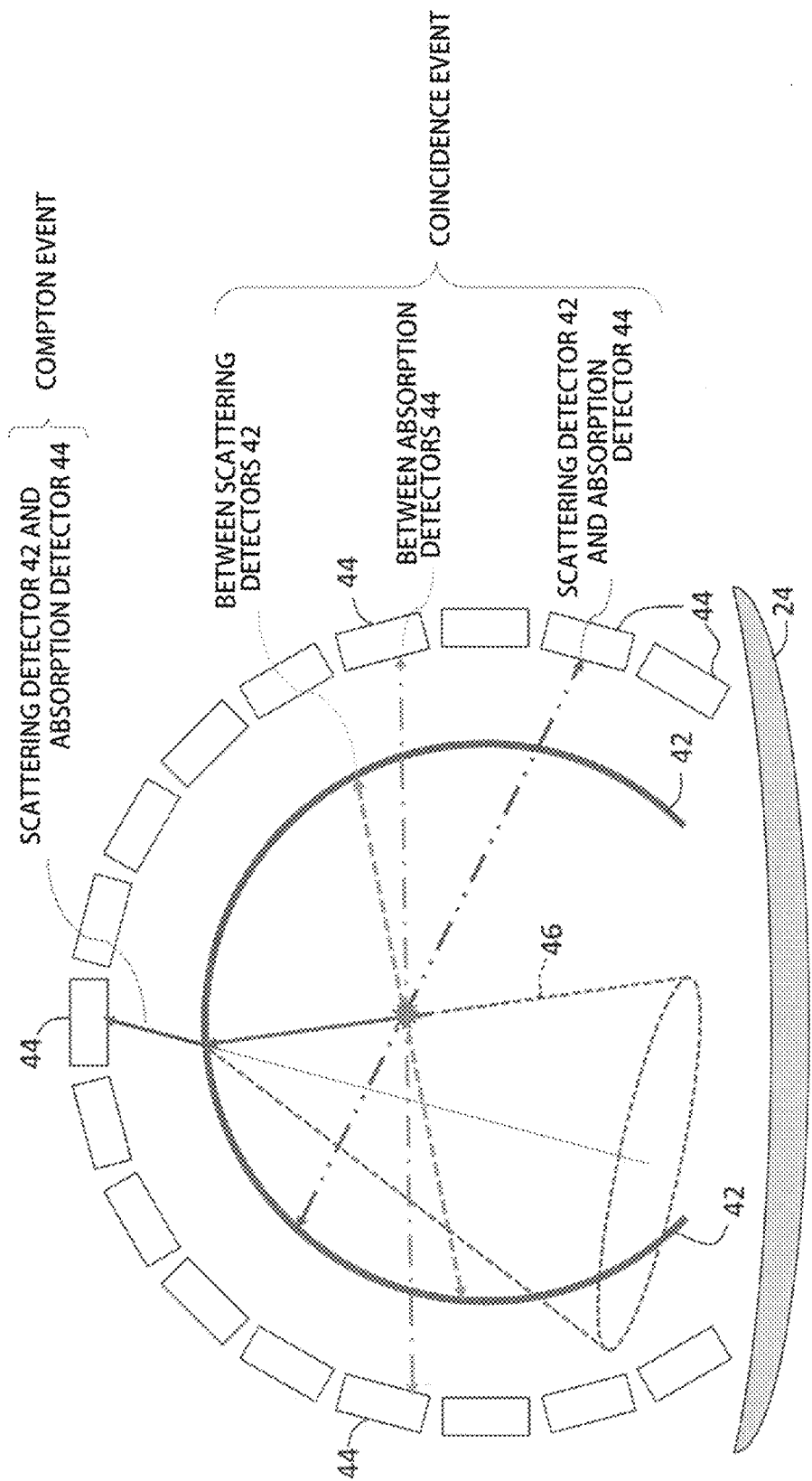
FIG. 13 is a cross-sectional view showing an overall configuration of a third embodiment of the present invention and classification of events measured by two single counts.

The gamma-ray of a Compton event is an incident gamma-ray that causes Compton scattering and is counted by a scattering detector 42 and is (photoelectrically) absorbed and counted by an absorption detector 44. As shown in FIG. 13, the position of such a gamma-ray can be identified as being on a conical surface 46 the vertex angle of which is determined by the detected energy. Even if the scattering detectors 42 are arranged, there are gamma-rays transmitted through and absorbed by the scattering detectors 42 without causing Compton scattering. Coincidence events can thus be measured between gamma-rays that lose all energy in the absorption detectors 44. Some gamma-rays may be absorbed between scattering detectors 42 or between a scattering detector 42 and an absorption detector 44. Both cases can be handled as coincidence events.

Figure 14:
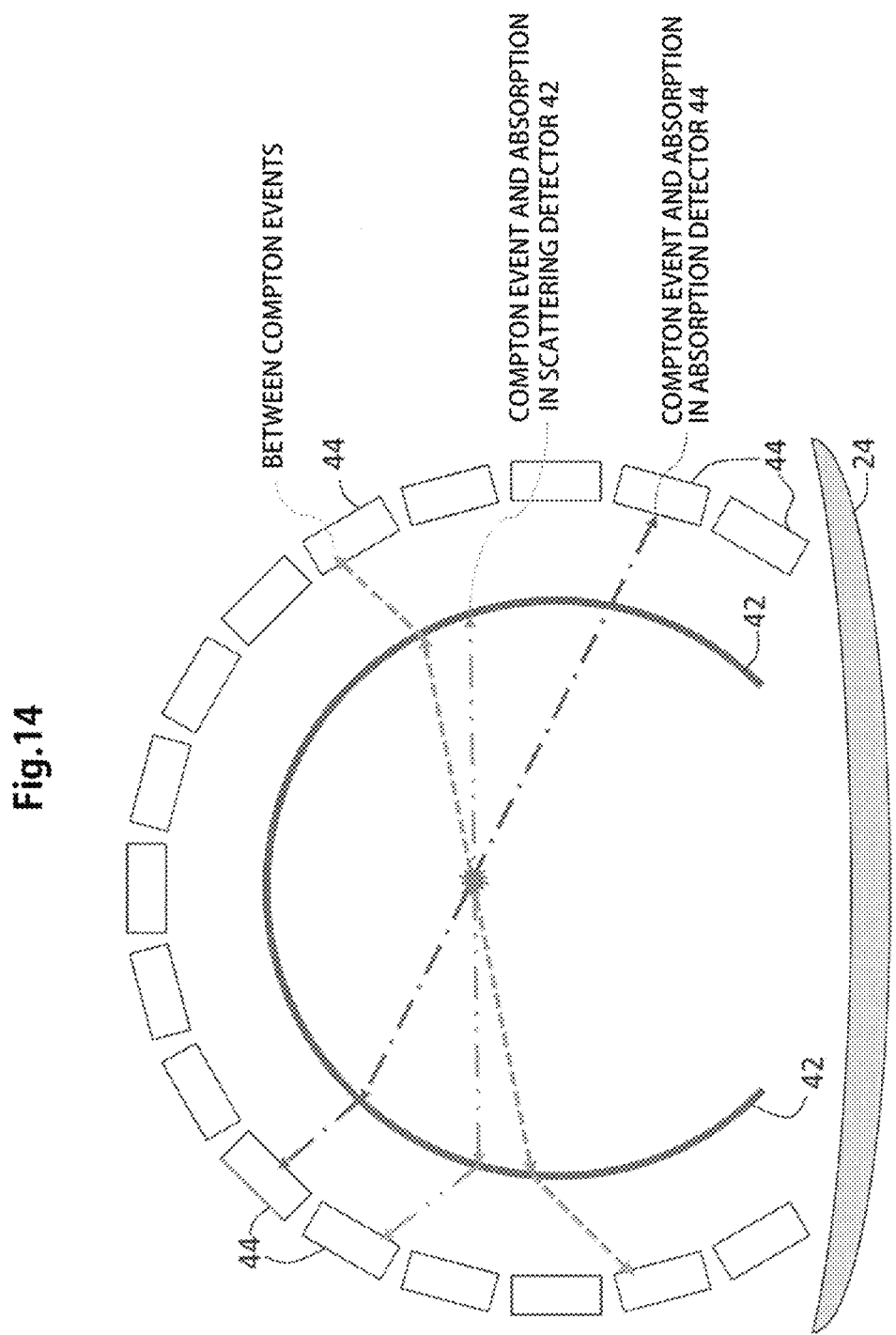
FIG. 14 is a cross-sectional view showing Compton events that can be handled as coincidence events of the same.

Either one of gamma-rays generated as a pair may be counted as a Compton event while the other is counted as an absorption event (phenomenon in which the energy of 511 keV is photoelectrically absorbed at a time). Such a case can be handled as a coincidence event between the scattering detector in which the Compton scattering occurs and the detector in which the absorption event occurs. Both gamma-rays may be counted as Compton events. Such a case can be handled as a coincidence event between the detection positions of the scattering detectors. In the case of a Compton event, the location of occurrence of the gamma-ray can only be identified as being on the conical surface 46. In the case of a coincidence event, the location of occurrence of the gamma-ray can be identified as being on a line. Handling Compton events as a coincidence event can thus provide a reconstructed image of higher image quality. FIG. 14 shows coincidence events including a Compton event or events.

Figure 15:
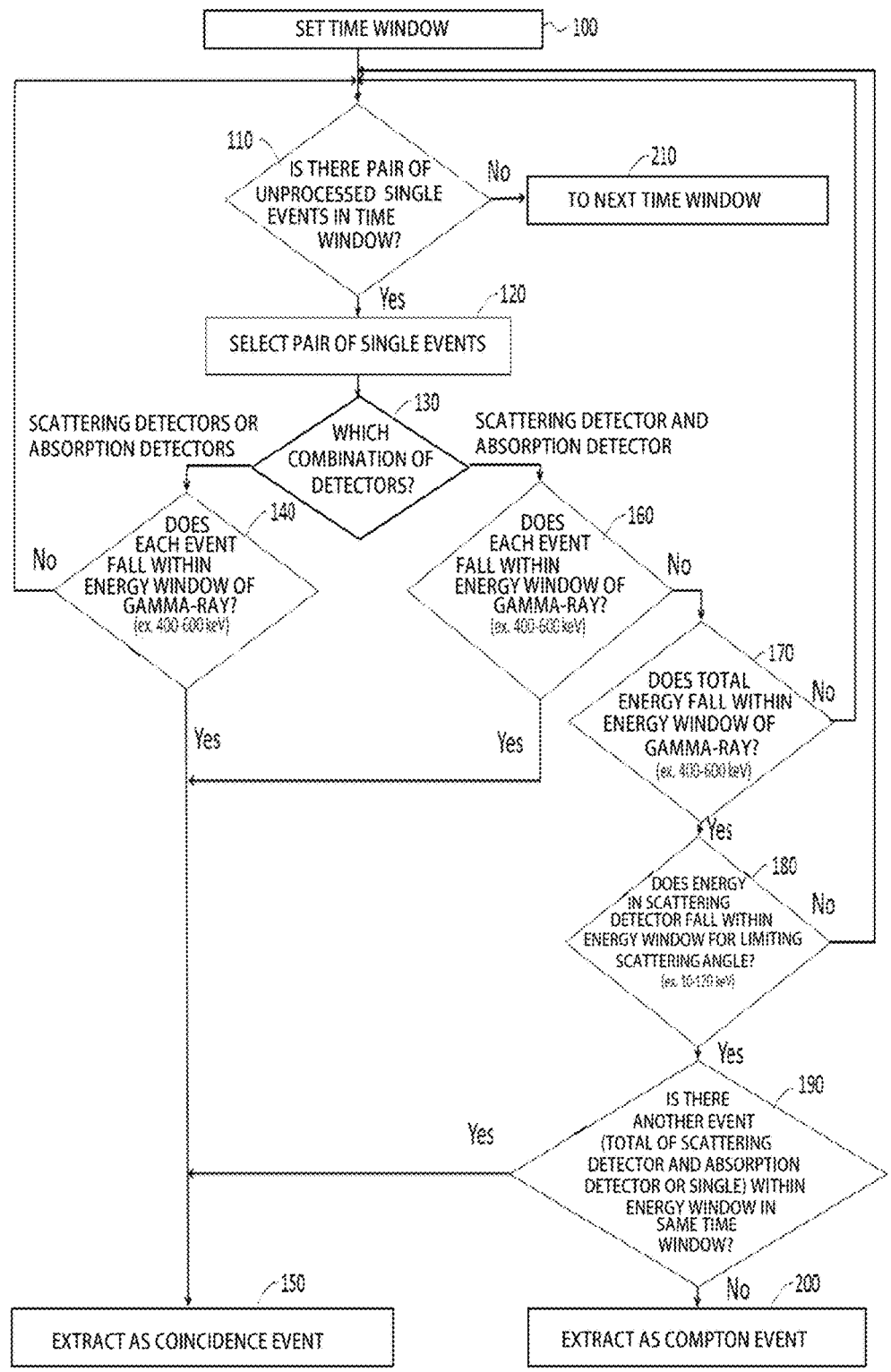
FIG. 15 is a flowchart showing a processing procedure of the same.

The counted events can be distinguished between Compton events, coincidence events, and noise by using time information and energy information. FIG. 15 shows a processing flow thereof.

All counts are recorded as single events. Initially, a time window is set (step 100). A pair of unprocessed single events detected in the time window is selected (steps 110 and 120). For example, the time window is set to within 20 ns or so in consideration of time resolution of the measurement system.

Suppose that the pair of single events is detected between scattering detectors or between absorption detectors (left in step 130). If the energy obtained in each of the events falls within an energy window of the original gamma-ray (Yes in step 140), the events are extracted as a coincidence event (step 150). Since annihilation radiations produce a pair of gamma-rays of 511 keV, the energy window of the gamma-ray is typically set to 400 keV to 600 keV in consideration of energy resolution.

If the events do not fall within the energy window of the gamma-ray (No in step 140), the events are considered to be noise components from scattering in a living body or the like, and are not extracted.

Suppose that the pair of single events in the time window are ones counted by a scattering detector and an absorption detector (right in step 130). If each event falls within the energy window of the gamma-ray (Yes in step 160), absorption is considered to have also occurred in the scattering detector and the single events are extracted as a coincidence event (step 150).

If the total energy obtained by the scattering detector and the absorption detector falls within the energy window of the gamma-ray (Yes in step 170), the events are identified as Compton scattering followed by absorption. Then, whether the location of occurrence of the Compton scattering is on the scattering detection side is further determined on the basis of the energy of the scattering detector. An event with a large scattering angle is likely to be a backscattering event in which backscattering occurs in the absorption detector and the gamma-ray is reflected to and absorbed by the scattering detector, with a large energy drop in the scattering detector. An energy window for limiting the scattering angle is therefore provided (step 180). For example, an event with an energy drop of approximately 120 keV or more in the scattering detector is ignored (No in step 180). Extremely low energy is difficult to detect. Suppose, for example, that the lower limit of detection of the energy of a single event is 10 keV. In such a case, an event in which the total energy in the scattering detector and the absorption detector falls within the energy window of the gamma ray (Yes in step 170) and the energy in the scattering detector is between 10 keV and 120 keV (Yes in step 180) is identified as a Compton event (step 190).

If there is no event to be paired with in the same time window (No in step 190), the event is identified as a single Compton event (step 200).

On the other hand, if there is an event (absorption event or Compton event) to be paired with the Compton event in the same time window (Yes in step 190), the events can be extracted as a coincidence event (step 150). Specifically, if there is a third single event detected in the same time window and its energy falls within the energy window of the gamma ray, the events are extracted as a coincidence event. If third and fourth single events occur in a scattering detector and an absorption detector and the total energy falls within both the energy window of the gamma-ray and the energy window for limiting the scattering angle of the scattering detector, the events are extracted as a coincidence event between the scattering detectors.

The extracted single events are omitted, and the processing is repeated until there is no unprocessed pair of single events in the time window (No in step 110). The processing then proceeds to the next time window (step 210).

The measurement of the lines of response 12 is desirably capable of time-of-flight measurement so that the location of occurrence of annihilation radiations is limited to a predetermined range on the lines of response 12.

Target nuclides may include a triple gamma-ray nuclide (such as $^{44}$Sc) which emits a certain ratio of single gamma-rays almost simultaneously with positron emission. In such a case, the radiations to be measured by the radiation detectors for measuring single gamma-rays are single gamma-rays, not annihilation radiations (both annihilation radiations and single gamma-rays may be measured).

Consequently, the position of the nuclide can be identified as being on a segment (in the case of time-of-flight measurement, a predetermined range on the segment) by the coincidence counting of the annihilation radiations, and the position on the segment can be identified by the measurement of the single gamma-ray (collimator method or Compton camera method).

Alternatively, the position of the nuclide can be identified as being on a segment or a conical surface by measuring either one of the gamma-rays of the annihilation radiations with a single gamma-ray radiation detector (collimator detector or Compton camera detector). Then, the position on the segment or conical surface can be identified by measuring the single gamma-ray with another single gamma-ray radiation detector (collimator detector or Compton camera detector).

Figure 16:
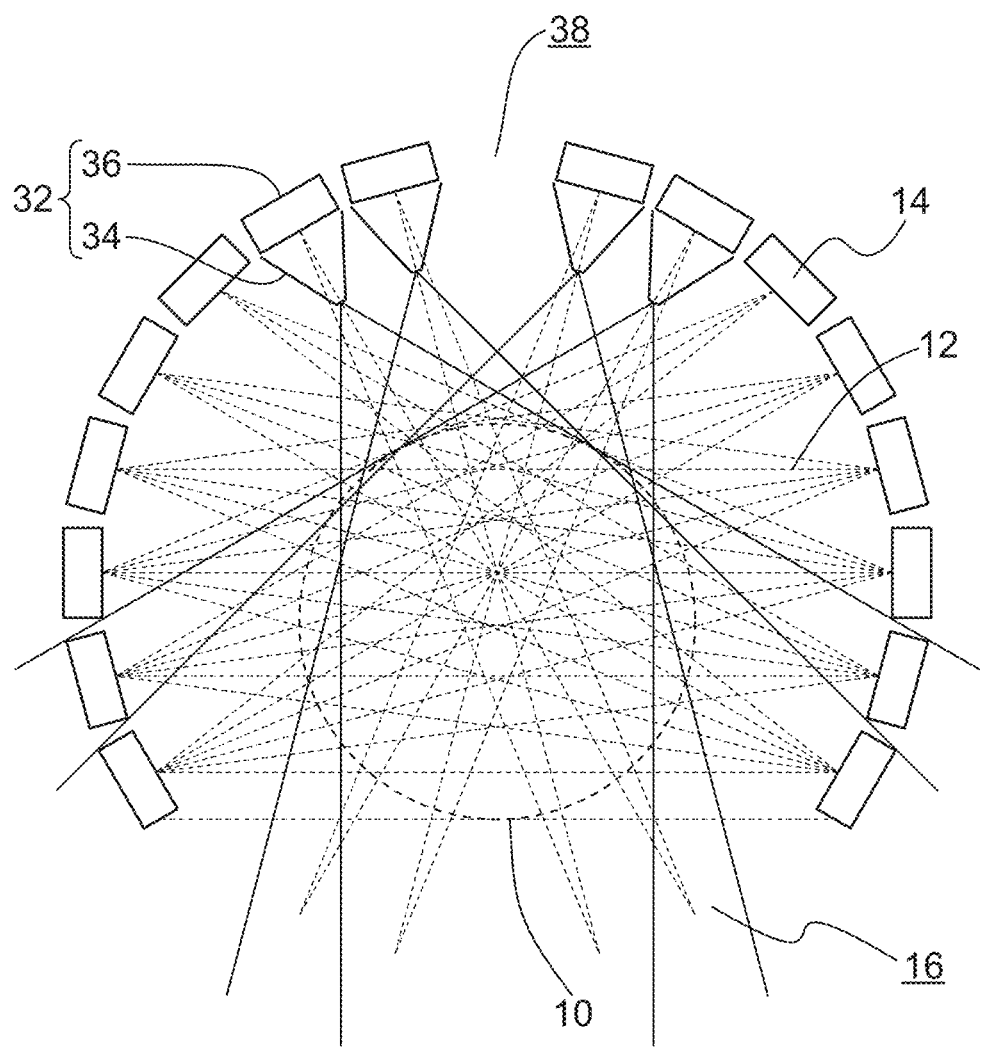
FIG. 16 is a cross-sectional view showing an overall configuration of a fourth embodiment of the present invention.

In any of the foregoing embodiments, the single gamma-ray radiation detectors 32 and 40 for measuring either one of the gamma-rays of the annihilation radiations are arranged on the opposite side of the field of view 10 from the missing area 16 of the coincidence detectors 14 of the detection ring. However, as in a fourth embodiment shown in FIG. 16, there may be provided a missing area 38 in which no single gamma-ray radiation detector (in the fourth embodiment, collimator detectors 32) is installed.

In such a case, a wide field of view can be provided for the patient who is the test subject, and thus claustrophobic patients can be accommodated. This also allows easy access to the test subject. A combination with an MRI device as will be described later enables easy transmission of MRI signals, and a drop in the image quality of an MRI image can be expected to be further suppressed.

Figure 17:
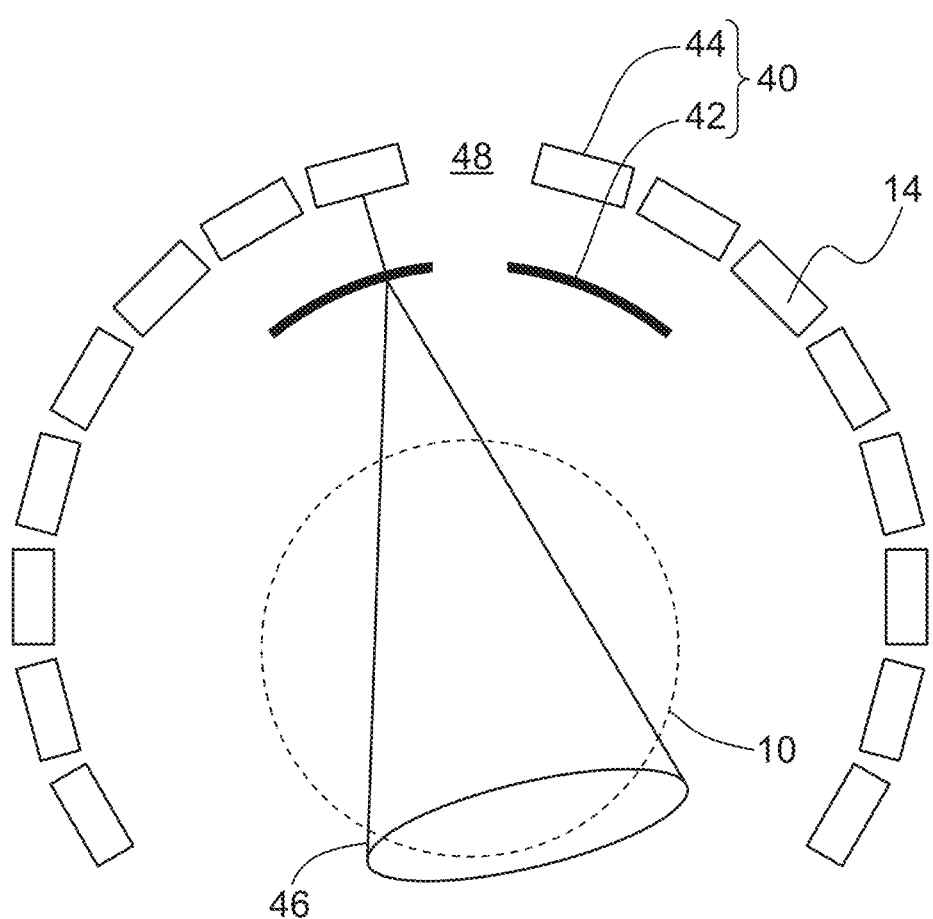
FIG. 17 is a cross-sectional view showing an overall configuration of a fifth embodiment of the present invention.

FIG. 17 shows a fifth embodiment of the present invention. In the present embodiment, a missing area 48 in which no Compton camera 40 is arranged is provided in the area where the Compton cameras 40 are arranged. In other respects, the fifth embodiment is the same as the fourth embodiment. A description thereof will thus be omitted.

In the foregoing first to fifth embodiments, the PET device is described to be a single device. However, the partial-ring PET device according to the present invention is particularly effective when installed in the bore of an MRI device so that PET measurement and MRI measurement can be simultaneously performed. The PET device can thus be added without a change to a commercially-available MRI device.

Figure 18:
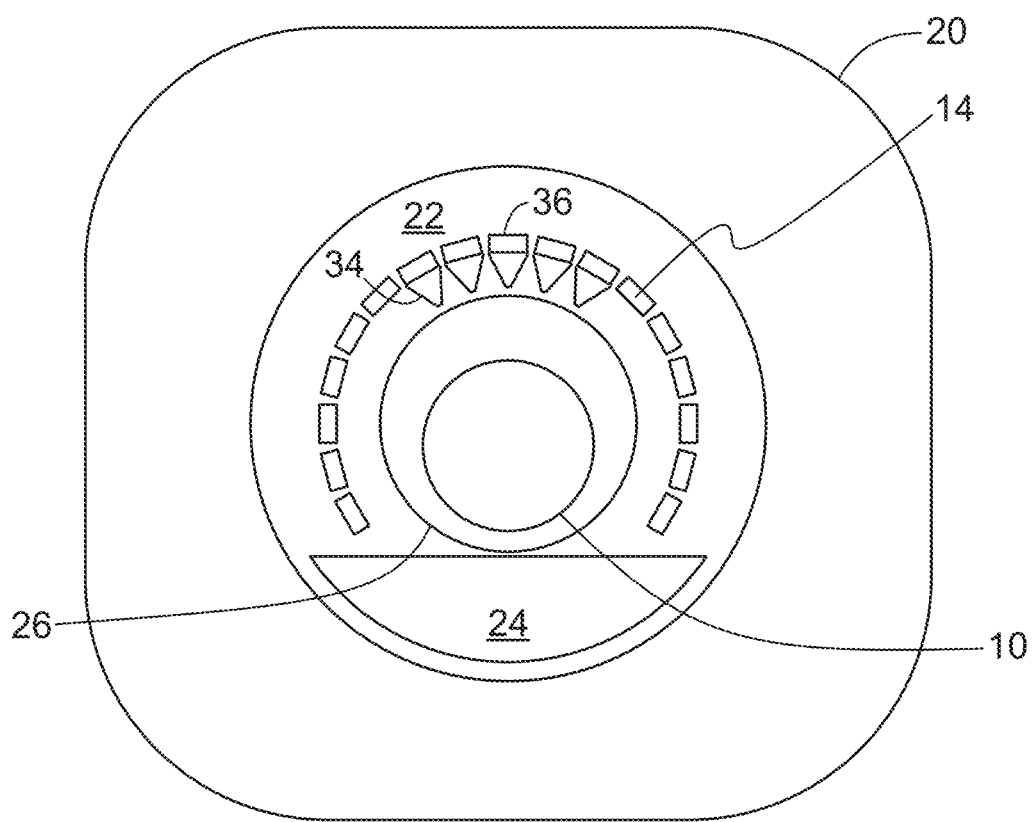
FIG. 18 is a cross-sectional view showing an overall configuration of a sixth embodiment of the present invention.

FIG. 18 shows a sixth embodiment of the present invention, which is applied to a hybrid PET/MRI device. The present embodiment is configured by incorporating the first embodiment shown in FIG. 3 into an MRI bore 22 of an MRI device 20.

Figure 19:
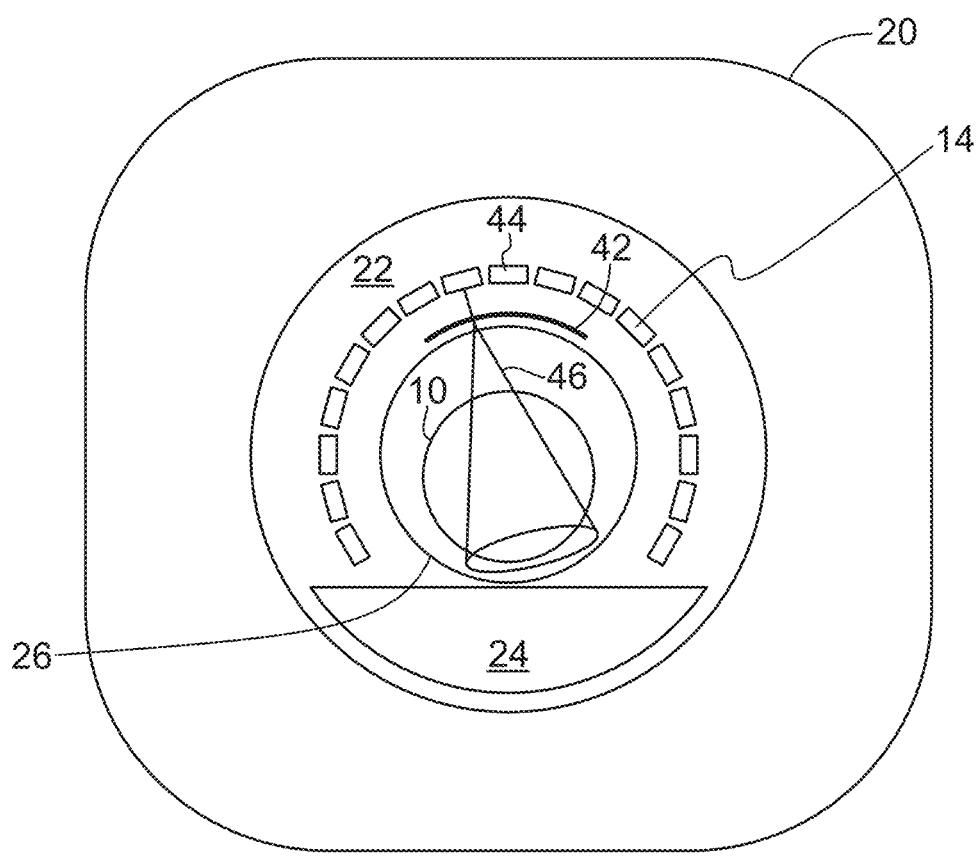
FIG. 19 is a cross-sectional view showing an overall configuration of a seventh embodiment of the present invention.

If the Compton cameras 40 are combined instead of the collimator detectors, as in a seventh embodiment shown in FIG. 19, the scattering detectors 42 are desirably installed outside an RF coil 26 to avoid RF interference.

On the other hand, to ensure positional resolution of the Compton cameras 40, the distance between the scattering detectors 42 and the absorption detectors 44 is desirably made as large as possible.

Figure 20:
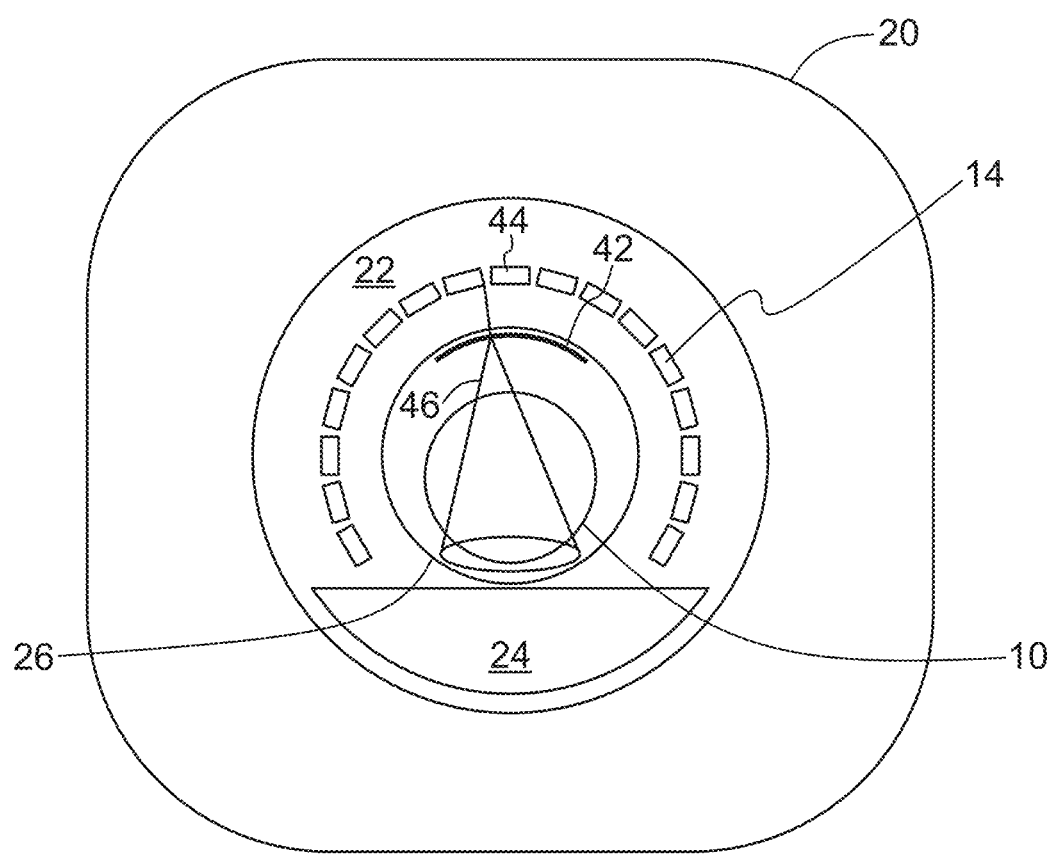
FIG. 20 is a cross-sectional view showing an overall configuration of an eighth embodiment of the present invention.

FIG. 20 shows an eight embodiment in which the scattering detectors 42 are arranged inside the RF coil 26 for that purpose.

Figure 21:
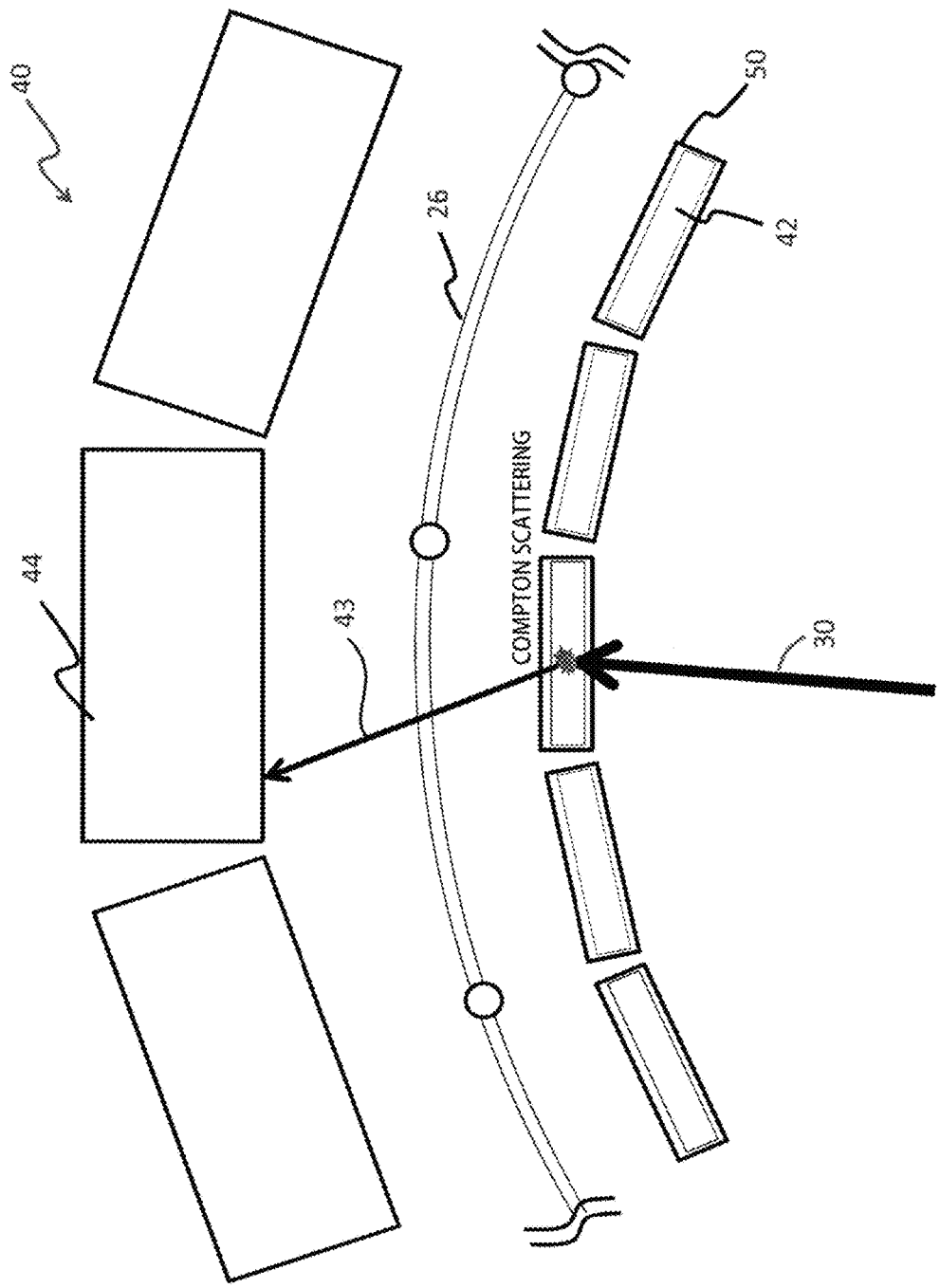
FIG. 21 is a cross-sectional view showing shields of the eight embodiment.

In the present embodiment, as shown in FIG. 21, the scattering detectors 42 are covered up with electromagnetic shields 50, such as copper foil and carbon fiber sheets, to prevent interference with the RF coil 26.

In the present embodiment, the distance between the scattering detectors 42 and the absorption detectors 44 of the Compton cameras 40 can be increased while avoiding RF interference by the shields 50. This improves the positional resolution of the Compton cameras 40.

Figure 22:
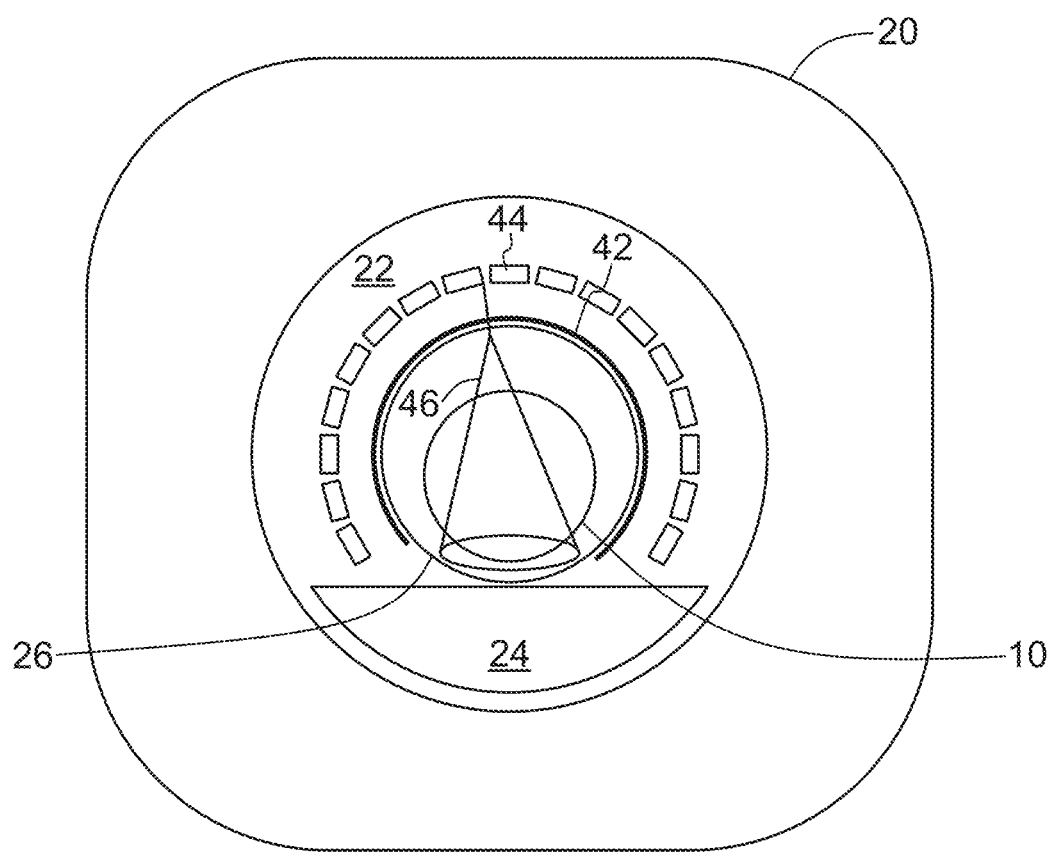
FIG. 22 is a cross-sectional view showing an overall configuration of a ninth embodiment of the present invention.

As has been described, the scattering detectors 42 of the Compton camera 40 scatter part of the gamma-rays and transmit most of the gamma-rays. A drop in the detection accuracy of the lines of response 12 is therefore minimal. Coincidence determination can be performed between scattering detectors 42. Whether there occurs Compton scattering or absorption can be identified from the energy measured by the scattering detectors 42. In a ninth embodiment of the present invention, as shown in FIG. 22, the scattering detectors 42 of the Compton cameras 40 are then configured to cover a wide range outside the RF coil 26 except a bed 24.

Figure 23:
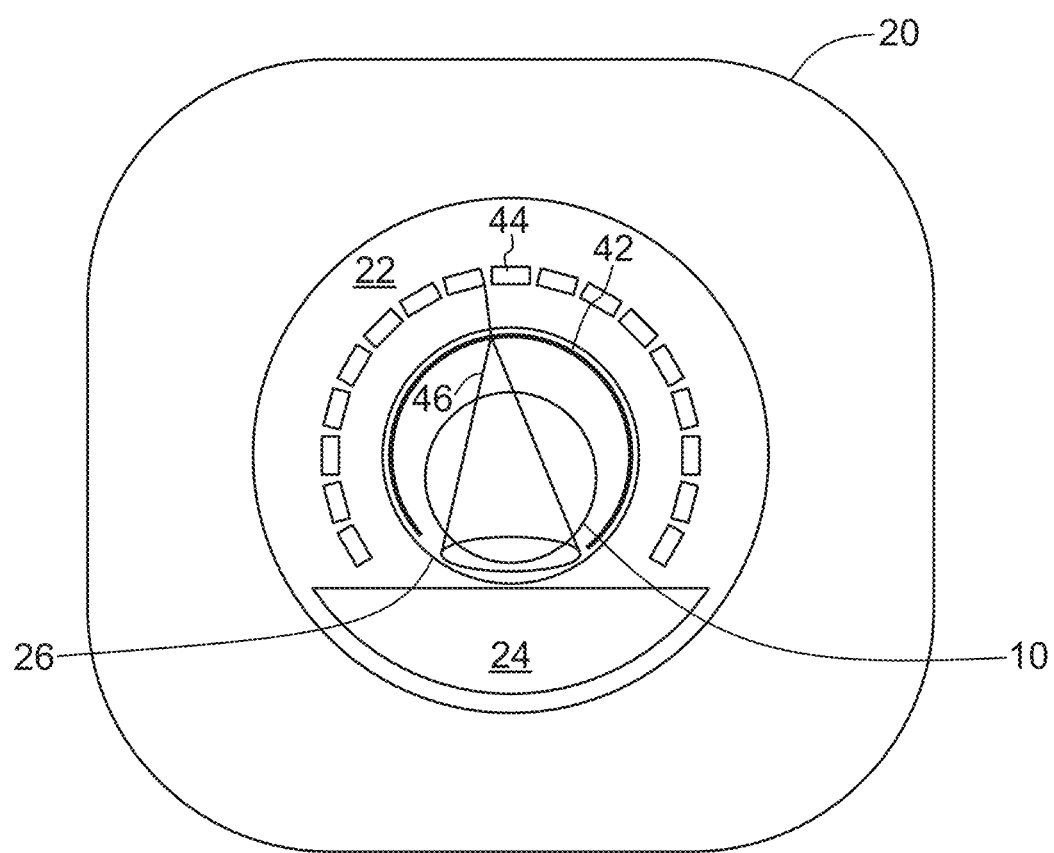
FIG. 23 is a cross-sectional view showing an overall configuration of a tenth embodiment of the present invention.

In a tenth embodiment shown in FIG. 23, the scattering detectors 42 of the Compton cameras 40 are arranged to cover a wide range inside the RF coil 26 except the bed 24.

Figure 24:
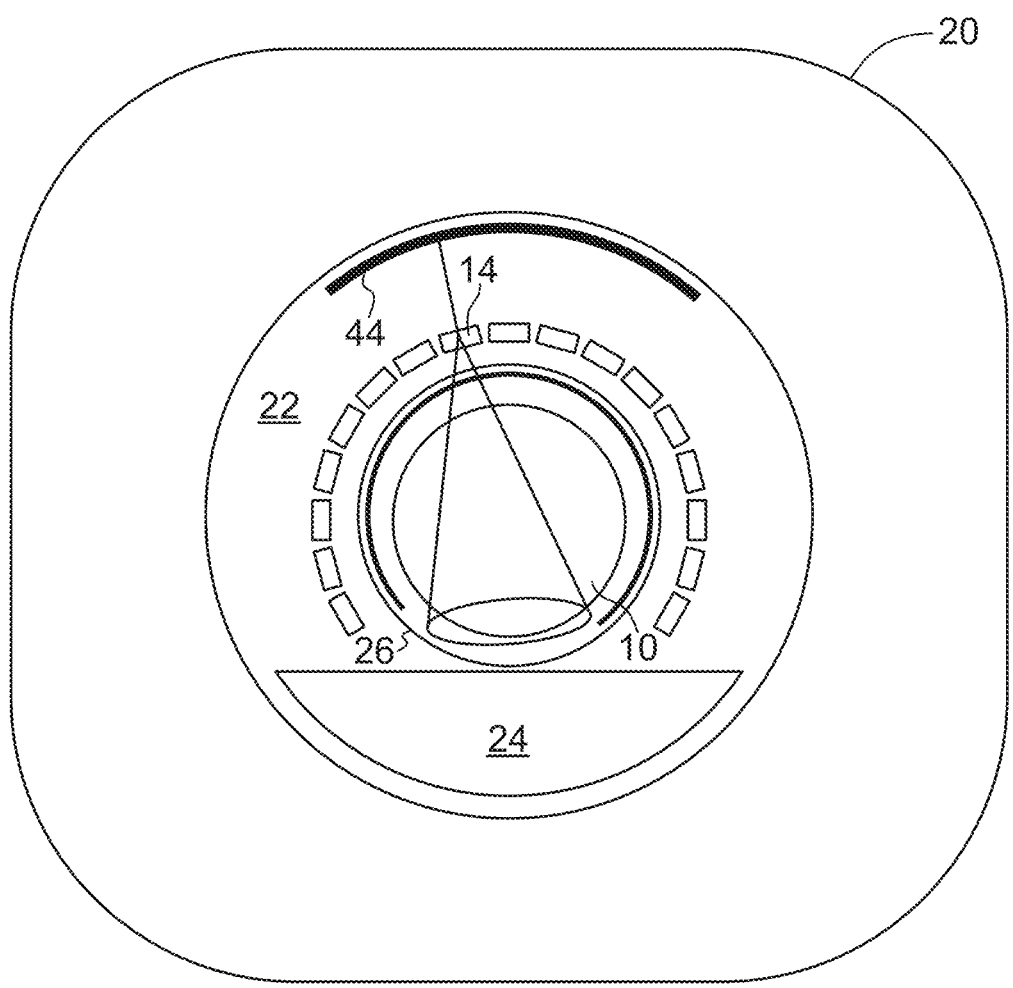
FIG. 24 is a cross-sectional view showing an overall configuration of an eleventh embodiment of the present invention.

In the coincidence detectors 14 which are PET detectors, part of incident gamma-rays cause Compton scattering and the scattered radiations fly out of the detector ring. Then, as in an eleventh embodiment shown in FIG. 24, absorption detectors 44 of Compton camera radiation detectors may be arranged outside the coincidence detectors (also serving as scattering detectors) 14 to detect the scattered radiations resulting from the Compton scattering in the coincidence detectors 14. Compton events can thus be detected.

In any of the foregoing embodiments, the coincidence detectors are arranged on the left and right, and the single gamma-ray radiation detectors are arranged above. However, the arrangement of the coincidence detectors and the single gamma-ray radiation detectors is not limited thereto.

In any of the foregoing embodiments, the PET device is described to be a partial-ring PET device in which some of the coincidence detectors are missing. However, the present invention is not limited to such applications. The present invention may also be applied to a PET device other than a partial-ring one, including a plurality of coincidence radiation detectors and a plurality of single gamma-ray radiation detectors arranged to cover the field of view.

It should be apparent to those skilled in the art that the above-described embodiments are merely illustrative which represent the application of the principles of the present invention. Numerous and varied other arrangements can be readily devised by those skilled in the art without departing from the spirit and the scope of the invention.

What is claimed is:

1. A partial-ring positron emission tomography (PET) device, comprising:

a plurality of coincidence radiation detectors arranged in a ring shape, the coincidence radiation detectors being configured to detect a line of response of annihilation radiations, wherein a first group of the coincidence radiation detectors includes oppositely arranged pairs of coincidence radiation detectors, and a second group of the coincidence radiation detectors does not include oppositely arranged pairs of coincidence radiation detectors such that pairs of the coincidence radiation detectors are missing continuously; and a single gamma-ray radiation detector, which is included in the second group, and is configured to detect one of the annihilation radiations as a single gamma-ray, the single gamma-ray radiation detector being provided in a region outside of a region where coincidence is detected by the first group of the coincidence radiation detectors, and provided where pairs of the coincidence radiation detectors in the second group are missing continuously, so as to compensate for a drop in image quality due to the pairs of the coincidence radiation detectors being missing, wherein the single gamma-ray radiation detector is a collimator radiation detector configured to identify an incident direction of an incident gamma-ray or a Compton camera radiation detector, and the first group of the coincidence radiation detectors, which includes the oppositely arranged pairs of coincidence radiation detectors, are not collimator radiation detectors.

2. The partial-ring PET device according to claim 1, wherein the single gamma-ray radiation detector is a Compton camera radiation detector including a scattering detector configured to cause Compton scattering of the incident gamma-ray and an absorption detector configured to photoelectrically absorb a scattered radiation.

3. The partial-ring PET device according to claim 2, wherein the coincidence radiation detectors also serve as absorption detectors of the Compton camera radiation detector.

4. The partial-ring PET device according to claim 2, wherein the coincidence radiation detectors also serve as scattering detectors of the Compton camera radiation detector.

5. The partial-ring PET device according to claim 2, wherein all the coincidence radiation detectors are Compton camera radiation detectors, and whether Compton scattering or absorption occurs is determined from energy measured by the scattering detectors of the Compton camera radiation detectors to allow detection of a line of response between the scattering detectors.

6. The partial-ring PET device according to claim 1, wherein the single gamma-ray radiation detector is installed on an opposite side of the field of view from a missing area of the coincidence radiation detectors of a detector ring.

7. The partial-ring PET device according to claim 6, wherein an installation area of the single gamma-ray radiation detector includes a missing area in which the single gamma-ray radiation detector is not arranged.

8. A partial-ring positron emission tomography (PET) device for use in a hybrid PET/magnetic resonance imaging (MRI) device, the partial-ring PET device, comprising:
the partial-ring PET device according to claim 1,
wherein the partial-ring PET device is configured to be arranged in a bore of an MRI device.

9. The partial-ring PET device for use in a hybrid PET/MRI device according to claim 8, wherein the partial-ring PET device includes a Compton camera radiation detector, and the Compton camera radiation detector has a scattering detector configured to be arranged outside a radio frequency coil of the MRI device.

10. The partial-ring PET device for use in a hybrid PET/MRI device according to claim 8, wherein the partial-ring PET device includes a Compton camera radiation detector, and the Compton camera radiation detector has a scattering detector that is electromagnetically shielded so that the scattering detector can be arranged inside a radio frequency coil of the MRI device.

11. A hybrid positron emission tomography (PET)/magnetic resonance imaging (MRI) device, comprising:
an MRI device with a bore; and
the partial-ring PET device according to claim 1 arranged in the bore of the MRI device.

12. A partial-ring positron emission tomography (PET) device, comprising:
a plurality of coincidence radiation detectors configured to detect a line of response of annihilation radiations, the coincidence radiation detectors being arranged in a partially-missing ring shape around a field of view, wherein
a first group of the coincidence radiation detectors includes oppositely arranged pairs of coincidence radiation detectors, and
a second group of the coincidence radiation detectors does not include oppositely arranged pairs of coincidence radiation detectors such that pairs of the coincidence radiation detectors are missing continuously, so as to form a continuously missing position in the partially-missing ring shape;
a single gamma-ray radiation detector that is arranged in a position opposed to the missing position, with the field of view being between the single gamma-ray radiation detector and the missing position, and the single gamma-ray radiation detector being configured to detect one of the annihilation radiations as a single gamma-ray, wherein
the single gamma-ray radiation detector is a collimator radiation detector configured to identify an incident direction of an incident gamma-ray or a Compton camera radiation detector, and
the first group of the coincidence radiation detectors, which includes the oppositely arranged pairs of coincidence radiation detectors, are not collimator radiation detectors; and
a circuit configured to reconstruct an image, while compensating for a drop in the image quality due to the missing pairs of the of the coincidence radiation detectors, based on a signal from the coincidence radiation detectors and a signal from the single gamma-ray radiation detector.

13. A positron emission tomography (PET) device, comprising:
a plurality of pairs of coincidence radiation detectors oppositely arranged to cover a field of view;
a plurality of single gamma-ray radiation detectors arranged to cover the same field of view,
wherein the plurality of single gamma-ray radiation detectors do not form a pair with respective oppositely arranged single gamma-ray radiation detectors,
each of the plurality of single gamma-ray radiation detectors is a collimator radiation detector configured to identify an incident direction of an incident gamma-ray or a Compton camera radiation detector, and
the plurality of pairs of coincidence radiation detectors, which are oppositely arranged to cover the a field of view, are not collimator radiation detectors; and
a circuit configured to reconstruct an image based on a signal from the pairs of coincidence radiation detectors and a signal from the single gamma-ray radiation detector output upon reception of annihilation radiations.

* * * * *